(12) United States Patent
Ye et al.

(10) Patent No.: US 11,147,137 B2
(45) Date of Patent: Oct. 12, 2021

(54) LIGHTING APPARATUS A PI-FILTER AND NON-ISOLATED SWITCH DRIVING CIRCUIT AND A BASE COMPRISING A METAL CONNECTOR

(71) Applicant: XIAMEN ECO LIGHTING CO. LTD., Xiamen (CN)

(72) Inventors: Hemu Ye, Xiamen (CN); Hongkui Jiang, Xiamen (CN); Wei Liu, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/773,658

(22) Filed: Jan. 27, 2020

(65) Prior Publication Data
US 2021/0029798 A1    Jan. 28, 2021

(30) Foreign Application Priority Data

Jul. 25, 2019    (CN) .......................... 201921179405.0

(51) Int. Cl.
*H05B 45/34*    (2020.01)
*H05B 45/37*    (2020.01)
(Continued)

(52) U.S. Cl.
CPC ............ *H05B 45/34* (2020.01); *F21K 9/238* (2016.08); *F21K 9/64* (2016.08); *F21K 9/66* (2016.08);
(Continued)

(58) Field of Classification Search
CPC ... F21K 9/66; F21K 9/238; F21K 9/64; F21V 29/70; F21V 29/10; F21Y 2115/10;
(Continued)

(56) References Cited

U.S. PATENT DOCUMENTS 9,301,352 B2 *   3/2016   Zhu ........................ H05B 47/10
9,414,450 B2 *   8/2016   van den Broeke ..........................
                                                    H05B 45/3725
(Continued)

FOREIGN PATENT DOCUMENTS

CN        204482119 U   *   7/2015
CN        111711355 A   *   2/2020

OTHER PUBLICATIONS

PT4223 datasheet ("1-5W Primary Side CC Regulator"; Published: Mar. 25, 2013). (Year: 2013).*

*Primary Examiner* — Borna Alaeddini
(74) *Attorney, Agent, or Firm* — Chun-Ming Shih; Lanway IPR Services

(57) ABSTRACT

A LED lighting apparatus has a circuit board and a base. The base is a hollow structure. The base with lateral wall has a conducting element. The circuit board is in the base and has a LED power driving circuit and a LED source. The LED power driving circuit has a full-bridge rectification. A π-filter circuit and a non-isolated switch driving circuit connected in order. An output terminal of the non-isolated switch driving circuit is connected with the LED source. The full-bridge rectification, the π-filter circuit and the non-isolated switch driving circuit are common grounded to form a power ground. The power ground is electronically connected with the conducting element in order to reduce the interference of an electromagnetic energy generated by the high-frequency switch signal to other appliances.

2 Claims, 20 Drawing Sheets

(51) Int. Cl.
*F21V 29/10* (2015.01)
*F21V 29/70* (2015.01)
*F21K 9/66* (2016.01)
*F21K 9/238* (2016.01)
*F21K 9/64* (2016.01)
*H05K 1/02* (2006.01)
*H05K 1/11* (2006.01)
*H05K 1/18* (2006.01)
*F21Y 105/18* (2016.01)
*F21Y 115/10* (2016.01)

(52) U.S. Cl.
CPC .............. *F21V 29/10* (2015.01); *F21V 29/70* (2015.01); *H05B 45/37* (2020.01); *H05K 1/0204* (2013.01); *H05K 1/0218* (2013.01); *H05K 1/111* (2013.01); *H05K 1/181* (2013.01); *F21Y 2105/18* (2016.08); *F21Y 2115/10* (2016.08); *H05K 2201/0723* (2013.01); *H05K 2201/1006* (2013.01); *H05K 2201/10106* (2013.01); *H05K 2201/10174* (2013.01); *H05K 2201/10522* (2013.01)

(58) Field of Classification Search
CPC ..... F21Y 2105/18; H05B 45/34; H05B 45/37; H05K 1/181; H05K 1/0218; H05K 1/0204; H05K 1/111; H05K 2201/1006; H05K 2201/10106; H05K 2201/10174; H05K 2201/0723; H05K 2201/10522
See application file for complete search history.

(56) References Cited

U.S. PATENT DOCUMENTS

2011/0057564 A1* 3/2011 Otake .................... H05B 45/10
315/51
2014/0252946 A1* 9/2014 Fujita .................... H05B 45/00
315/51

* cited by examiner

LIGHTING APPARATUS A PI-FILTER AND NON-ISOLATED SWITCH DRIVING CIRCUIT AND A BASE COMPRISING A METAL CONNECTOR

FIELD

The present invention is related to a device and more particularly related to a LED lighting apparatus.

BACKGROUND

Lighting or illumination is the deliberate use of light to achieve a practical or aesthetic effect. Lighting includes the use of both artificial light sources like lamps and light fixtures, as well as natural illumination by capturing daylight. Daylighting, using windows, skylights, or light shelves, is sometimes used as the main source of light during daytime in buildings. This can save energy in place of using artificial lighting, representing a major component of energy consumption in buildings. Proper lighting may enhance task performance, and improve the appearance of an area, or have positive psychological effects on occupants.

Indoor lighting is usually accomplished by using light fixtures, and lighting is also a key part of interior design. Lighting may also be an intrinsic component of landscape projects. A complete lighting system may change the entire mood of a room. The color and the design of the lighting fixture may change how human feel about an area. Play with different layers of light and see how a place being transform.

A light-emitting diode (LED) is a semiconductor light source that emits light when current flows through. Electrons in the semiconductor recombine with electron holes, releasing energy in the form of photons. This effect is called electroluminescence. The color of the light (corresponding to the energy of the photons) is determined by the energy required for electrons to cross the band gap of the semiconductor. White light is obtained by using multiple semiconductors or a layer of light-emitting phosphor on the semiconductor device.

Appearing as practical electronic components was in 1962. The earliest LEDs emit low-intensity infrared light. Infrared LEDs are used in remote-control circuits, such as those used with a wide variety of consumer electronics. The first visible-light LEDs were of low intensity and limited to red. Modern LEDs are available across the visible, ultraviolet, and infrared wavelengths, with high light output.

Early LEDs were often used as indicator lamps, replacing small incandescent bulbs, and in seven-segment displays. Recent developments have produced white-light LEDs suitable for room lighting. LEDs have led to new displays and sensors, while their high switching rates are useful in advanced communications technology.

LEDs have many advantages over incandescent light sources, including lower energy consumption, longer lifetime, improved physical robustness, smaller size, and faster switching. Light-emitting diodes are used in applications as diverse as aviation lighting, automotive headlamps, advertising, general lighting, traffic signals, camera flashes, lighted wallpaper and medical devices.

The color of light emitted from an LED is neither coherent nor monochromatic, however, the spectrum is narrow with respect to human vision, and functionally monochromatic.

The energy efficiency of electric lighting has increased radically since the first demonstration of arc lamps and the incandescent light bulb of the 19th century. Modern electric light sources come in a profusion of types and sizes are adapted into many applications. Most modern electric lighting is powered by centrally generated electric power, but lighting may also be powered by mobile or standby electric generators or battery systems. Battery-powered light is often reserved for when and where stationary lights fail, often in the form of flashlights, electric lanterns, and in vehicles.

Although lighting devices are widely used, there are still opportunities and benefits to improve the lighting devices to provide more convenient, low cost, reliable and beautiful lighting devices for enhancing human life.

SUMMARY

A LED lighting apparatus is capable of solving problems including the LED lighting apparatus meeting the certificated standard is incapable of applying switch driving technique to carry out the design of placing a driver on board, furthermore, in capable of regulating a broad input voltage while maintaining high-efficient production.

The LED lighting apparatus has a circuit board and a base. The base is a hollow structure. The base with lateral wall has a conducting element. The circuit board is in the base and has a LED power driving circuit and a LED source. The LED power driving circuit has a full-bridge rectification, a π-filter circuit and a non-isolated switch driving circuit connected in order. An output terminal of the non-isolated switch driving circuit is connected with the LED source. The full-bridge rectification, the π-filter circuit and the non-isolated switch driving circuit are common grounded to form a power ground. The power ground is electronically connected with the conducting element.

The LED lighting apparatus has the circuit board placed in the base being a hollow structure. The power ground is electronically connected with the conducting element of the base of the lighting apparatus, in addition, leads a high-frequency switch signal of the power driving circuit to a metal conducting portion of the base of the LED lighting apparatus and reduces the interference of an electromagnetic energy generated by the high-frequency switch signal to other appliances.

The LED lighting apparatus meeting the certificated standard is capable of applying switch driving technique to carry out the design of placing a driver on board and regulating a broad input voltage while maintaining high-efficient production for better usability and practicality.

A lighting apparatus includes a circuit board. A circuit board includes a light source emitting light and a power driving circuit electrically connecting to the light source. A source of the optical signal in an optical transmission system and is capable of taking the form of a fiber optic transmission system or free space optics system. A light-emitting diode is used in multimode fiber such as glass optical fiber or plastic optical fiber.

A light bulb produces light from accepting energy such as electricity. The light bulb is capable of being used to show an electronic is on, or to direct traffic, for heat, and for many other purposes to lighten up a dark place. The light bulb is even used in outer space. A laser is also a device emitting light through a process of optical amplification based on the stimulated emission of electromagnetic radiation. The laser may be used in different sections, such as in communications, medicine, industry, military, law enforcement, to name a few. In addition, a halogen lamp is also known as a quartz halogen. The halogen lamp is an advance form of an incandescent lamp. The incandescent lamp is the second form of electric light to be developed for commercial use after a carbon arc lamp. There are advantages of the halogen lamp. The halogen lamp is small and lightweight, low cost to produce, better color temperature, longer life than a conventional incandescent, instant on to full brightness, no warm-up time needed, and is dimmable.

The lighting apparatus has a base supporting the circuit board. The base includes a conducting element. The power driving circuit is electrically connected to the conducting element. The power driving circuit includes a full-bridge rectification circuit. A π-filter circuit and a non-isolated switch driving circuit electrically are connected in sequence. An output end of the non-isolated switch driving circuit is connected to the light source. The full-bridge rectification circuit, the π-filter circuit and the non-isolated switch driving circuit cooperatively form a power ground. The power ground is connected to the conducting element via a metal contact pad.

The metal contact pad has a first segment and a second segment. The metal contact pad is connected to the first segment. The first segment is from the power ground and extends to an edge of the circuit board. The second segment extends along a side of the circuit board and connects to the conducting element.

A full-bridge rectification input terminal is a positive electrode input of a LED power driving circuit. The full-bridge rectification circuit is connected to a power signal to output a voltage signal from a positive output terminal, and a negative output terminal is connected to a ground. A first input terminal is connected to a positive output terminal of the full-bridge rectification circuit. A first output terminal of the π-filter circuit is connected to a positive electrode output of the LED power driving circuit. A second input terminal of the π-filter circuit is connected to the ground. A second output terminal of the π-filter circuit is connected to the second input terminal of the non-isolated switch driving circuit. The first input terminal of the non-isolated switch driving circuit is connected to the first output terminal of the π-filter circuit. The first output terminal of the non-isolated switch driving circuit is connected to the positive electrode output of the LED power driving circuit. The second output terminal of the non-isolated switch driving circuit is connected to a negative electrode output of the LED power driving circuit. A ground terminal of the non-isolated switch driving circuit is connected to the ground.

The π-filter circuit may include a first inductor, a first capacitor, and a second capacitor. A first terminal of the first inductor is connected to the first input terminal of the π-filter circuit. A second terminal of the first inductor is connected to the first output terminal of the π-filter circuit. The first terminal of the first inductor is connected to the first terminal of the first capacitor. The second terminal of the first capacitor is common grounded with the second terminal of the second capacitor. The second terminal of the first capacitor is connected to the second terminal of the second capacitor. The second terminal of the second capacitor is connected to a power ground.

The first terminal of the first capacitor and the first terminal of the second capacitor are connected to the first input terminal of the π-filter circuit. The second terminal of the second capacitor and the second terminal of the first inductor is connected to the second output terminal of the π-filter circuit. The second terminal of the second capacitor and the second terminal of the first inductor is connected to the second output terminal of the π-filter circuit. The second terminal of the first capacitor is common grounded with the first terminal of the first inductor. The second terminal of the second capacitor is connected to the second terminal of the first inductor and a power ground.

The non-isolated switch driving circuit includes a diode, a first resistor, a second resistor, a third resistor, a second inductor, a third capacitor, and a driving chip. A first pin of the driving chip is used as the first input terminal of the non-isolated switch driving circuit. The first terminal of the second inductor is used as the second output terminal of the non-isolated switch driving circuit. The second terminal of the first resistor and the second terminal of the second resistor are connected to the second input terminal of the non-isolated switch driving circuit. A positive electrode of the diode is connected to a second pin of the driving chip and the second terminal of the second inductor. The positive electrode of the diode is connected to the positive electrode output of the LED power driving circuit. The first terminal of the third capacitor is connected to the negative electrode output of the LED power driving circuit. The second terminal of the third capacitor is connected to the positive electrode output of the LED power driving circuit. The first terminal of the third resistor is connected to the positive electrode output of the LED power driving circuit. The second terminal of the third resistor is connected to the negative electrode output of the LED power driving circuit. A third pin of the driving chip is connected to the first terminal of the first resistor and the first terminal of the second resistor. The second terminal of the first resistor, the second terminal of the second resistor, and a fourth pin of the driving circuit are common grounded.

The light apparatus has a light cover fixing to the base. The light cover covers the circuit board and forms a chamber between the circuit board and the light cover. A light over may be different colors such as red, yellow or any other colors, however, the light cover may be translucent, and the circuit board is not directly visible from an outside of the light cover, and an intensity of a light emitted by the light source is reduced to 60% when passing through the light cover. The light cover may be in different shapes such as a sphere, a cone, a cylinder, a pyramid or a cube. A light bulb may be a small tube-shaped bulb, a candle-flame-shaped bulb, or a small globe-shaped bulb. The light cover and the base may be connected in several ways. The base may be a screw, bayonet, wedge, or bi-pin base. The light cover and the base may be connected in several ways according the different light covers and various base type.

The light cover has a conversion structure configured to change wavelength of the light emitted by the light source. The conversion structure includes a phosphor layer on an inner surface of the light cover. A conversion layer is on a surface of the light cover, and the conversion layer is a hollow structure filled with a plurality of quantum dots. The outer insulation layer extends along a direction opposite to the base and forms a step structure, and an edge of the circuit board abuts against the step structure.

In some embodiments, the light source includes LEDs. The LEDs are light sources utilizing diodes that emit light when connected in a circuit. The effect is a form of electro luminescence where LEDs release a large number of photons outward. The LED may be housed in a bulb that concentrates the light source.

In an embodiment, a thermal conducting layer is configured on a surface of the circuit board, and an edge of the thermal conducting layer thermally communicates with the outer insulation layer. The function of the insulation layer is to reduce heat dissipation to the surroundings so that the thermal efficiency of the heat collector may be improved. Requirements for the insulation layer material are good heat insulation, in other word, requirements for the insulation layer material have small heat conductivity, low deformability, no volatility, no tax gas, and no water absorption.

LEDs may be on a periphery of the circuit board and increase a heat dissipation efficiency. Heat dissipation is closely related to energy dissipation. Energy dissipation is a measure of energy lost due to other forces. Energy losing may be occurred in many forms, such as kinetic energy loss caused by the forces of friction. Heat dissipation is simply a subtype of energy dissipation. Heat may be dissipated through many different methods. First, convection is a transfer of heat through moving fluids. An example of this is capable to be a convection oven that uses air (the fluid) to transfer heat. Second, conduction allows heat to dissipate throughout a material and possibly into a different material that is in contact with the hot material. An example is an electric stovetop that is heated through electrical resistance. Third, in radiation, heat is dissipated through electromagnetic waves. This type of heat dissipation is illustrated by a microwave oven.

A metal shielding layer is between the outer insulation layer and the conducting element. A gap between the metal shielding layer and the conducting element is in a range between a hundred millimeter to two hundred millimeters. In addition, the base may have an outer insulation layer and cover with the conducting element. The base may include an inner insulation layer. The conducting element is inserted between the outer insulation layer and the inner insulation layer. A top surface of the conducting element has a wave structure configured to contact the circuit board.

DETAILED DESCRIPTION

Figure 1:
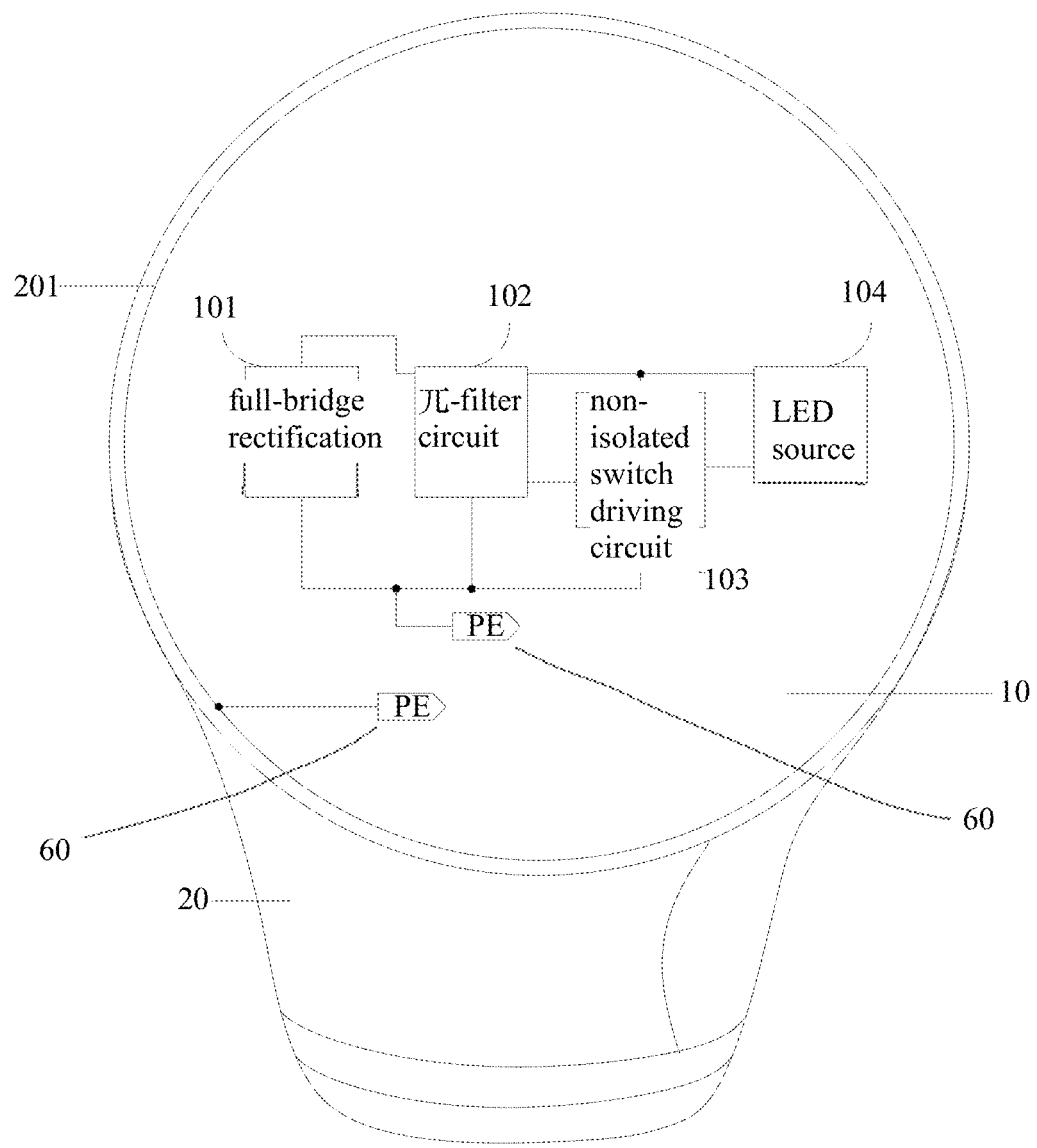
FIG. 1 is a perspective view illustrating an embodiment of a LED lighting structure.

Referring to FIG. 1, perspective view illustrating an embodiment of a LED lighting structure. When a switch driving power drives the LED lighting apparatus, an occlude and a shut-off of a switch tube occur immediately in a high frequency. If the switch driving power is placed on a metal circuit board, the problem of electromagnetic compatibility raises due to a voltage interference and an electromagnetic radiation of a power terminal, being incapable of meeting the standard of electromagnetic compatibility in countries and areas. The driving power of the LED lighting apparatus meeting the certificated standard is incapable of applying the design of placing the driver on board, furthermore, in capable of regulating a broad input voltage and maintaining high-efficient production.

Referring to FIG. 1, the LED lighting apparatus has a circuit board 10 and a base 20. The base 20 is a hollow structure. The base 20 with lateral wall has a conducting element 201. The circuit board 10 is in the base 20. The circuit board 10 has a LED power driving circuit and a LED source 104. The LED power driving circuit has a full-bridge rectification 101, a π-filter circuit 102 and a non-isolated switch driving circuit 103 is connected in order. An output terminal of the non-isolated switch driving circuit 103 is connected with the LED source 104. The full-bridge rectification 101, the π-filter circuit 102 and the non-isolated switch driving circuit 103 are common grounded to form a power ground 60. The power ground 60 is electronically connected with the conducting element 201.

In an embodiment, the base 20 further has an outer insulation layer placed around the conducting element 201. Understandably, a rim of the circuit board 10 is capable of propping with a top end of the conducting element 201 or a step structure placed on the top of the outer insulation layer. In this embodiment, the rim of an optimized circuit board 10 props with the top end of the conducting element 201 to increase heat dissipation efficiency of the working circuit board 10.

In an embodiment, the conducting element is an electroplating layer being placed onto the internal of the outer insulation layer. In other embodiments, the base 20 has the outer insulation layer, a conducting layer and an inner insulation layer set in order from external to internal, the conducting layer is the conducting element 201 and at least exposes partly on the inner insulation layer, electronically connecting with the power ground. The conducting element 201 leading a high-frequency switch signal to the base 20 reduces an electromagnetic energy generated by the high-frequency switch signal to other appliances, shielding an electromagnetic interference.

The circuit board 10 is metal based. More particularly, the circuit board 10 is capable of being aluminum-copper based, ferro-aluminum based, or other material based. The base 20 is a heat-dissipating structure of the LED lighting apparatus. An external wall of the base 20 is the outer insulation layer. When the source has higher power, the LED lighting apparatus generates more heat. By setting the conducting element 201 is capable of being aluminum-embedded onto an internal wall of the heat-dissipating structure, the rim of the circuit board 10 is capable of thermal connecting with an aluminum-embedded element, fast conducting the heat to the heat-dissipating structure, and further increasing the heat-dissipating speed. The conducting element 201 is also capable of being made by other metals, such as copper, iron or stainless steel. The LED source 104 has a plurality of LEDs.

Figure 2:
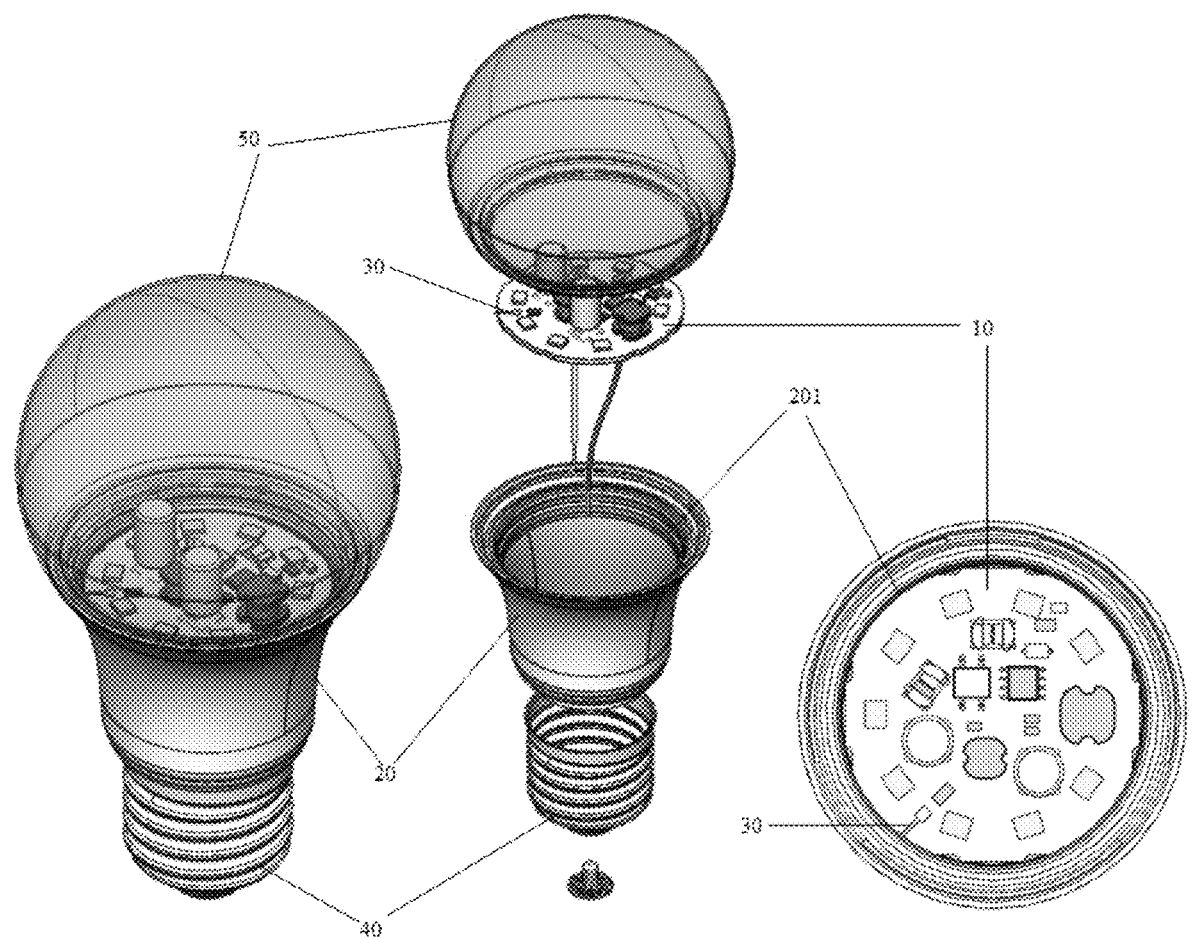
FIG. 2 is a perspective view illustrating another embodiment of a LED lighting entire body structure.

Referring to FIG. 2, a power ground common grounded by the full-bridge rectification. The π-filter circuit and the non-isolated switch driving circuit connects with the conducting element 201 with either a conducting contact pad 30 or a conducting wire. In an embodiment, a metal contact pad 30 is capable of having a first section electronically connecting with the circuit board 10 at one end and a second section extending from the other end of the first section to the lateral wall of the circuit board 10. The second section is set along the rim of the lateral wall of the circuit board 10. The second section props with the internal wall of the base 20 when the second section fixed to connect with the circuit board 10 and the internal wall of the base 20. The metal contact pad 30 electronically connects with the conducting elements 201 of the internal wall of the base 20.

Referring to FIG. 2, an embodiment of a first section and a second section of a metal contact pad 30 are integral. The first section is perpendicular to the second section. The first section and the second section have the same width. The first section is longer than the second section. More particularly, a size of the metal contact pad 30 is capable of being set according to the size of the circuit board. The first section of the metal contact pad 30 welds above a DOB circuit board at one end, and the other end of the first section bends down along the rim of the circuit board. When the circuit board is set in the base, the rim of the circuit board fixed tightens the internal wall of the base, the other end bends down of the metal contact pad 30 fixed clamps between the circuit board and the internal wall of the base 20, making the metal contact pad 30 electronically connects with the conducting elements 201 of the internal wall of the base 20.

Referring to FIG. 2, the LED lighting apparatus has a connector 40 and a transparent light bulb cover 50. The connector 40 is on one side of the base 20 and electronically connects with the circuit board. The transparent light bulb has a cover 50 on the other side of the base 20.

This embodiment conducts the power ground of the LED power driving circuit, electronically connecting the power ground with the conducting element of the base with either the metal contact pad or a conducting wire. A switch driving power placed on the circuit board is capable of effectively conducting the high-frequency switch signal to the conducting element of the base when an occlude and a shut-off of a switch tube occur immediately in a high frequency, reducing the interference of the electromagnetic energy generated by the high-frequency switch signal to other appliances, shielding the electromagnetic interference and fulfilling the requirement of electromagnetic compatibility; meanwhile applying switch driving technique to carry out the design of placing a driver on board, furthermore, maintaining high-efficient production.

Figure 3:
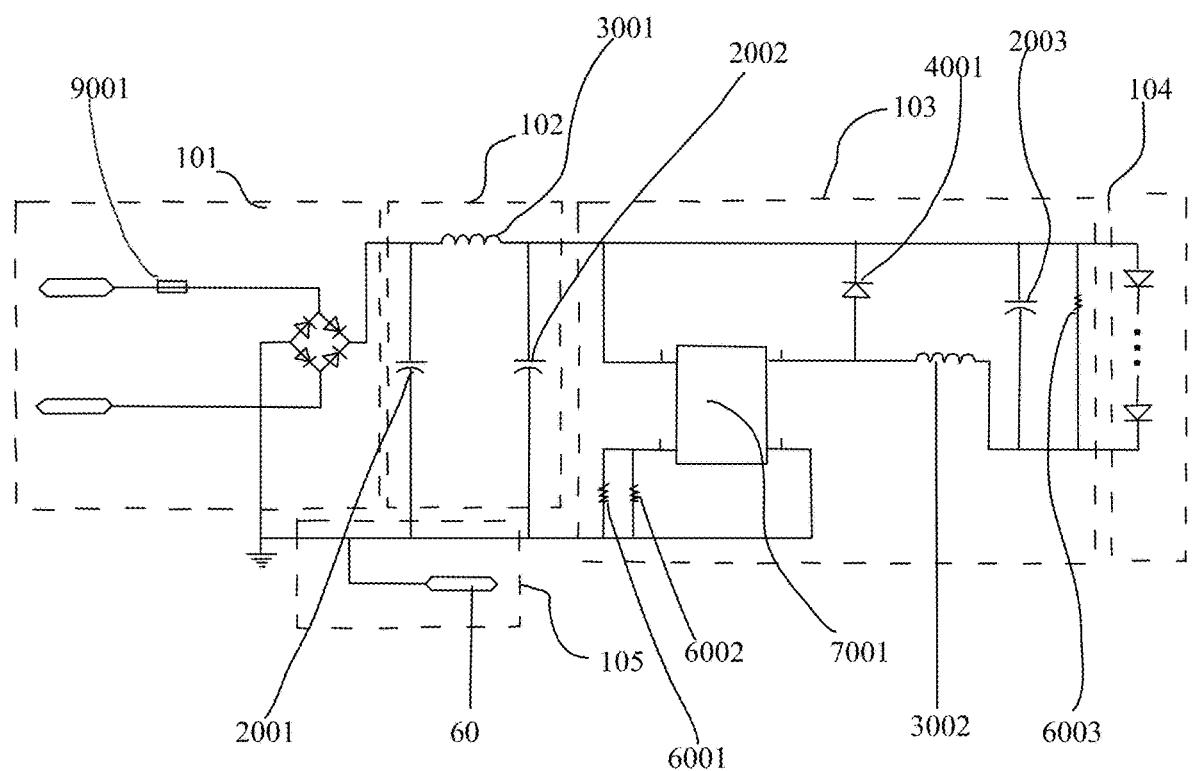
FIG. 3 is a schematic diagram showing an embodiment of a LED power driving circuit structure.

Referring to FIG. 3, a perspective view of an embodiment of a LED lighting structure. A LED power driving circuit has the full-bridge rectification 101, the π-filter circuit 102, the non-isolated switch driving circuit 103, the LED source 104, and the power ground 105. An input terminal of the full-bridge rectification 101 is an input anode of the LED power driving circuit. The full-bridge rectification 101 connects a power signal to output a voltage signal from the input anode, an output cathode connects with the ground.

A first input terminal of the π-filter circuit 102 connects with the input anode of the full-bridge rectification 101, a first output terminal of the π-filter circuit 102 connects with an output anode of the LED power driving circuit, a second input terminal of the π-filter circuit 102 connects with the ground, a second output terminal of the π-filter circuit 102 connects with the second input terminal of the non-isolated switch driving circuit 103.

The first input terminal of the non-isolated switch driving circuit 103 connects with the first output terminal of the π-filter circuit 102, the first output terminal of the non-isolated switch driving circuit 103 connects with the output anode of the LED power driving circuit, the second output terminal of the non-isolated switch driving circuit 103 connects with the output cathode of the LED power driving circuit, the grounding terminal of the non-isolated switch driving circuit 103 is grounded.

The output anode of the LED power driving circuit connects with the anode of the LED source 104, the output cathode of the LED power driving circuit connects with the cathode of the LED source 104. The full-bridge rectification 101, the π-filter circuit 102 and the non-isolated switch driving circuit 103 are common grounded to form the power ground 105.

Referring to FIG. 3, in an embodiment of the π-filter circuit 102 has a first inductor 3001, a first capacitor 2001 and a second capacitor 2002. A first terminal of the first inductor 3001 is the first input terminal of the π-filter circuit 102, a second terminal of the first inductor 3001 is the first output terminal of the π-filter circuit 102. The first terminal of the first inductor 3001 connects with the first terminal of the first capacitor 2001, the second terminal of the first inductor 3001 connects with the first terminal of the second capacitor 2002, the second terminal of the first capacitor 2001 and the second terminal of the second capacitor 2002 are common grounded, the second terminal of the first capacitor 2001 and the second terminal of the second capacitor 2002 are common grounded to form a power ground 60.

Figure 4:
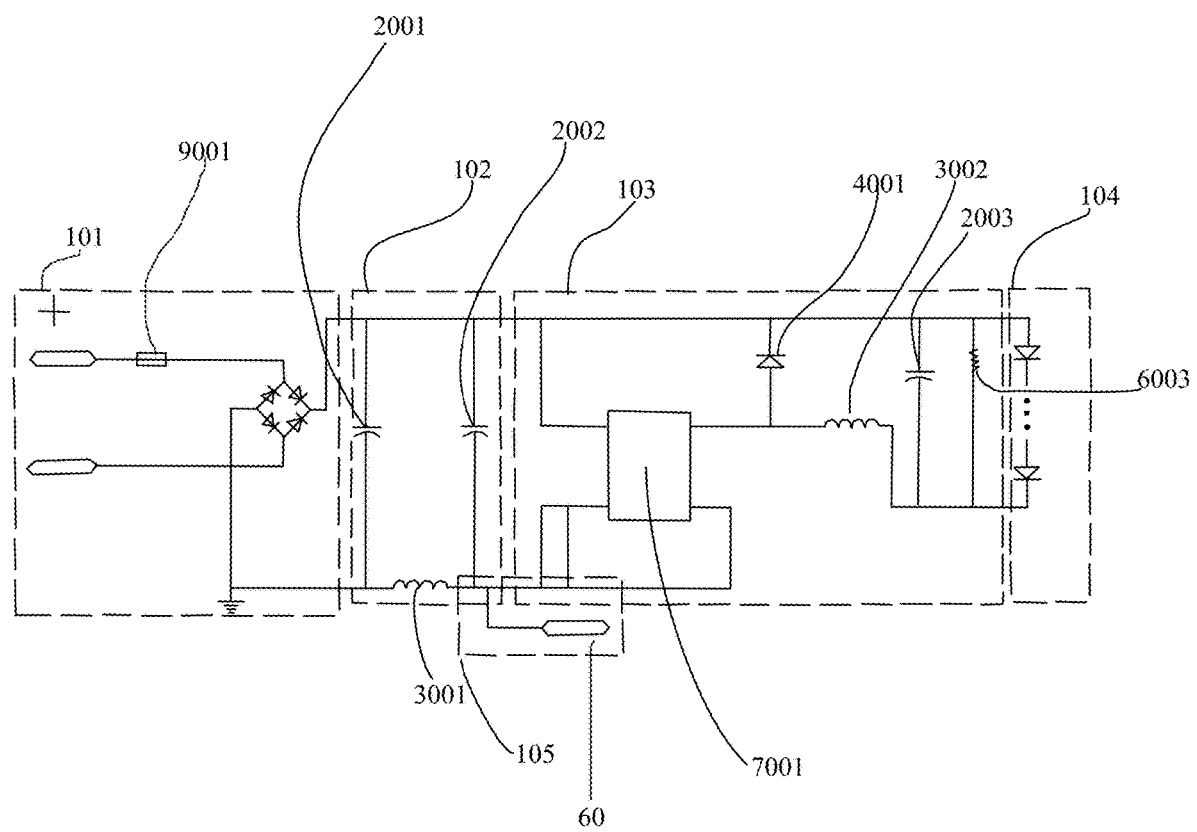
FIG. 4 is a schematic diagram showing another embodiment of a LED power driving circuit structure.

Referring to FIG. 4, in another embodiments, the first terminal of the first capacitor 2001 or the first terminal of the second capacitor 2002 is the first input terminal of the π-filter circuit 102 The second terminal of the second capacitor 2002 or the second terminal of the first inductor 3001 is the second output terminal of the π-filter circuit 102. The second terminal of the first capacitor 2001 and the first terminal of the first inductor 3001 are common grounded. The second terminal of the second capacitor 2002 and the second terminal of the first inductor 3001 are common grounded to form the power ground 60. The first inductor L1 is a 3.0 mH chip inductor. The first capacitor 2001 and the second capacitor 2002 are 2.2 µF patch electrolysis capacitor having voltage endurance of 400 voltage.

Referring to FIGS. 3 and 4, the non-isolated switch driving circuit 103 being a buck-framed LED constant current driving circuit has a diode 4001, a first resistor 6001, a second resistor 6002, a third resistor 6003, a second inductor 3002, a third capacitor 2003 and a driving chip 7001.

A first pin of the driving chip 7001 is the first input terminal of the non-isolated switch driving circuit 103. The first terminal of the second inductor 3002 is the second output terminal of the non-isolated switch driving circuit 103. The second terminal of the first resistor 6001 or the second terminal of the second resistor 6002 is the second input terminal of the non-isolated switch driving circuit 103.

An anode of the diode 4001 connects respectively with a second pin of the driving chip 7001 and the second terminal of the second inductor 3002. A cathode of the diode 7001 connects with the output anode of the LED power driving circuit.

The first terminal of the third capacitor 2003 connects with the output anode of the LED power driving circuit. The second terminal of the third capacitor 2003 connects with the output cathode of the LED power driving circuit. The first terminal of the third resistor 6003 connects with the output anode of the LED power driving circuit. The second terminal of the third resistor 6003 connects with the output cathode of the LED power driving circuit.

A third pin of the driving chip 7001 connects respectively with the first terminal of the first resistor 6001 and the first terminal of the second resistor 6002. The second terminal of the first resistor 6001. The second terminal of the second resistor 6002 and a fourth pin of the driving chip 7001 are common grounded.

The full-bridge rectification is a full-bridge rectifier having four diodes. A thermal relay 9001 is placed on the input terminal of the rectification. More particularly, through experimental data testing and comparing, there are two kinds of light with power driving circuit set. A lighting apparatus one and A lighting apparatus two. The metal circuit board of the lighting apparatus one does not weld the metal contact pad or set the conducting wire. The power ground of the LED power driving circuit does not electrically connect with the conducting element of the base. The metal circuit board of the lighting apparatus two connects the metal contact pad or sets the conducting wire. The power ground of the LED power driving circuit electrically connects with the conducting element of the base with the metal contact pad or the conducting wire. A concrete configuration of the LED power driving circuit has two kinds of power driving circuit corresponding to the π-filter circuit provided by the embodiments above.

Results of testing to the two lights according to different standard. A result of the voltage interference of the power terminal in a live wire according to EN five-five-zero-one-five standard. The live wire corresponding to the lighting apparatus one.

TABLE ONE

| Frequency (MHz) | Quasi Peak (dBμV) | Meas. Time (ms) | Bandwidth (kHz) | Filter | Line | Corr. (dB) | Margin (dB) | Limit (dBμV) |
| --- | --- | --- | --- | --- | --- | --- | --- | --- |
| 0.528000 | 60.8 | 1000.0 | 9.000 | Off | L1 | 9.8 | −4.8 | 56.0 |
| 0.874500 | 64.7 | 1000.0 | 9.000 | Off | L1 | 9.8 | −8.7 | 56.0 |
| 1.054500 | 62.9 | 1000.0 | 9.000 | Off | L1 | 9.8 | −6.9 | 56.0 |

TABLE TWO

| Frequency (MHz) | CAverage (dBμV) | Meas. Time (ms) | Bandwidth (kHz) | Filter | Line | Corr. (dB) | Margin (dB) | Limit (dBμV) |
| --- | --- | --- | --- | --- | --- | --- | --- | --- |
| 0.318000 | 50.2 | 1000.0 | 9.000 | Off | L1 | 9.8 | −1.2 | 49.0 |
| 0.523500 | 44.3 | 1000.0 | 9.000 | Off | L1 | 9.8 | 1.7 | 46.0 |
| 1.050000 | 45.6 | 1000.0 | 9.000 | Off | L1 | 9.8 | 0.4 | 46.0 |

Figure 5:
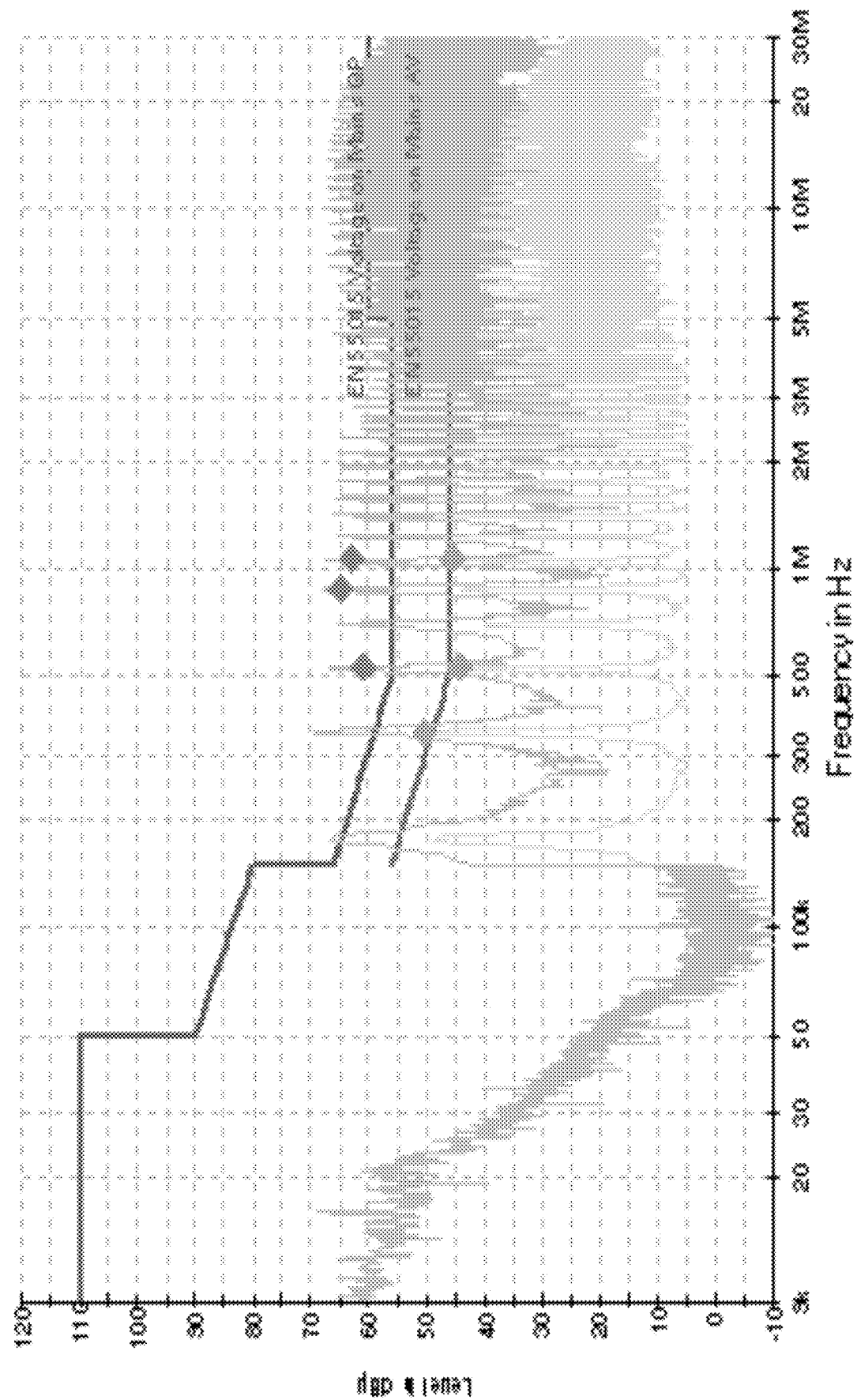
FIG. 5 is a waveform showing an embodiment of an experimental data of an apparatus one.

Referring to FIG. 5, a waveform shows an experimental data of a lighting apparatus one according to table one and table two.

TABLE THREE

| Frequency (MHz) | Quasi Peak (dBμV) | Meas. Time (ms) | Bandwidth (kHz) | Filter | Line | Corr. (dB) | Margin (dB) | Limit (dBμV) |
| --- | --- | --- | --- | --- | --- | --- | --- | --- |
| 0.163500 | 50.0 | 1000.0 | 9.000 | Off | L1 | 9.8 | 15.3 | 65.3 |
| 0.168000 | 51.3 | 1000.0 | 9.000 | Off | L1 | 9.8 | 13.7 | 65.1 |
| 0.334500 | 44.3 | 1000.0 | 9.000 | Off | L1 | 9.8 | 15.0 | 59.3 |

TABLE FOUR

| Frequency (MHz) | CAverage (dBμV) | Meas. Time (ms) | Bandwidth (kHz) | Filter | Line | Corr. (dB) | Margin (dB) | Limit (dBμV) |
| --- | --- | --- | --- | --- | --- | --- | --- | --- |
| 0.163500 | 36.0 | 1000.0 | 9.000 | Off | L1 | 9.8 | 19.3 | 55.3 |
| 0.168000 | 38.9 | 1000.0 | 9.000 | Off | L1 | 9.8 | 16.1 | 55.1 |
| 0.334500 | 33.2 | 1000.0 | 9.000 | Off | L1 | 9.8 | 16.1 | 49.3 |

Figure 6:
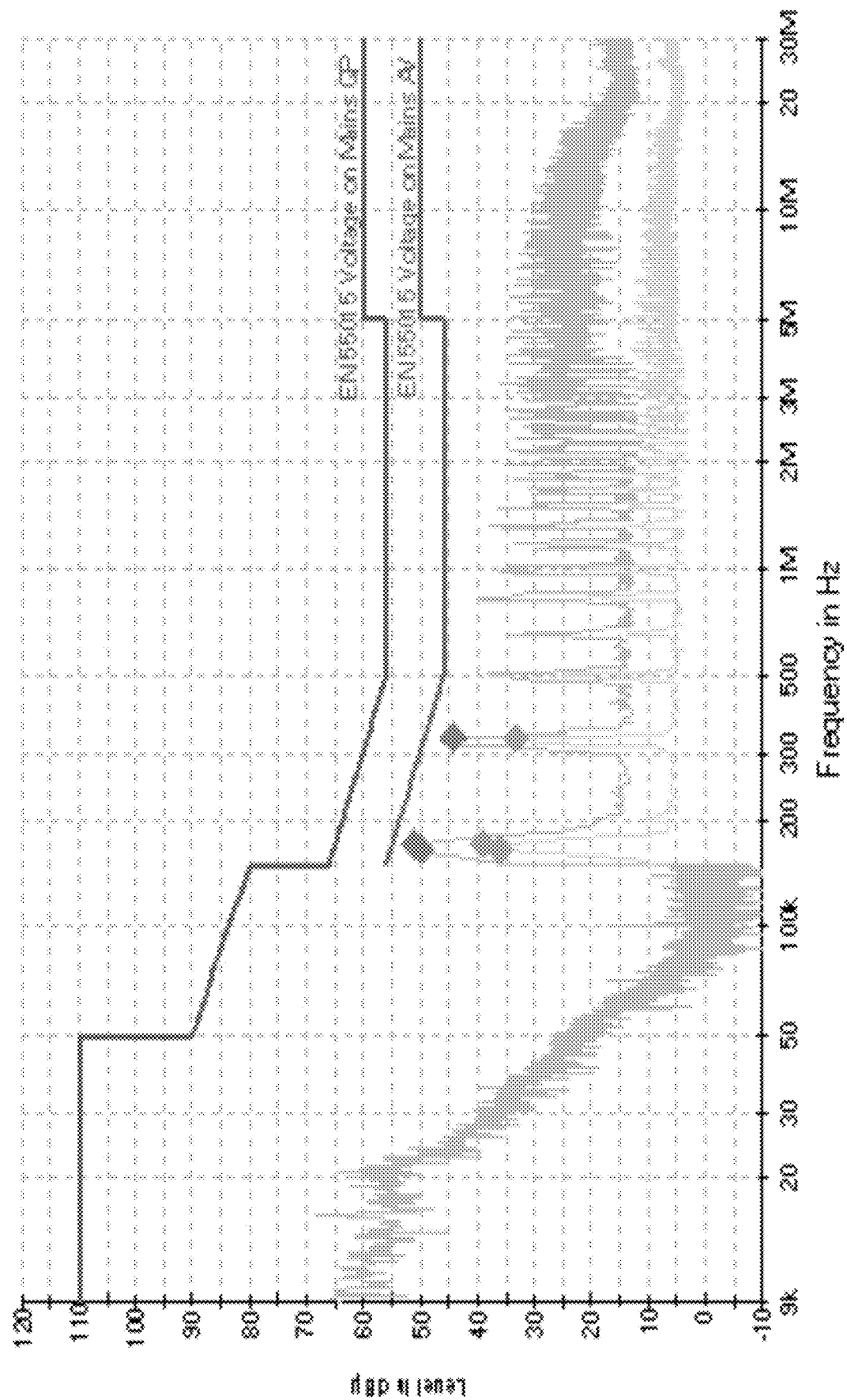
FIG. 6 is a waveform showing an embodiment of an experimental data of an apparatus two.

Referring to FIG. 6, a waveform shows an experimental data of a lighting apparatus two according to table three and table four.

TABLE FIVE

| Frequency (MHz) | MaxPeak-MaxHold (dBµV) | Filter | Line | Corr. (dB) | Margin (dB) | Limit (dBµV) |
|---|---|---|---|---|---|---|
| 0.186000 | 53.8 | Off | L1 | 9.8 | 10.5 | 64.2 |
| 0.375000 | 48.2 | Off | L1 | 9.8 | 10.2 | 58.4 |
| 0.564000 | 44.1 | Off | L1 | 9.8 | 11.9 | 56.0 |
| 1.099500 | 41.2 | Off | L1 | 9.8 | 14.8 | 56.0 |
| 1.279500 | 40.1 | Off | L1 | 9.8 | 15.9 | 56.0 |
| 1.878000 | 40.1 | Off | L1 | 9.8 | 15.9 | 56.0 |

TABLE SIX

| Frequency (MHz) | Average-MaxHold (dBµV) | Filter | Line | Corr. (dB) | Margin (dB) | Limit (dBµV) |
|---|---|---|---|---|---|---|
| 0.186000 | 41.7 | Off | L1 | 9.8 | 12.5 | 54.2 |
| 0.375000 | 38.2 | Off | L1 | 9.8 | 10.2 | 48.4 |
| 0.564000 | 32.4 | Off | L1 | 9.8 | 13.6 | 46.0 |
| 0.933000 | 26.2 | Off | L1 | 9.8 | 19.8 | 46.0 |
| 1.122000 | 28.1 | Off | L1 | 9.8 | 17.9 | 46.0 |
| 1.315500 | 26.2 | Off | L1 | 9.8 | 19.8 | 46.0 |

Figure 7:
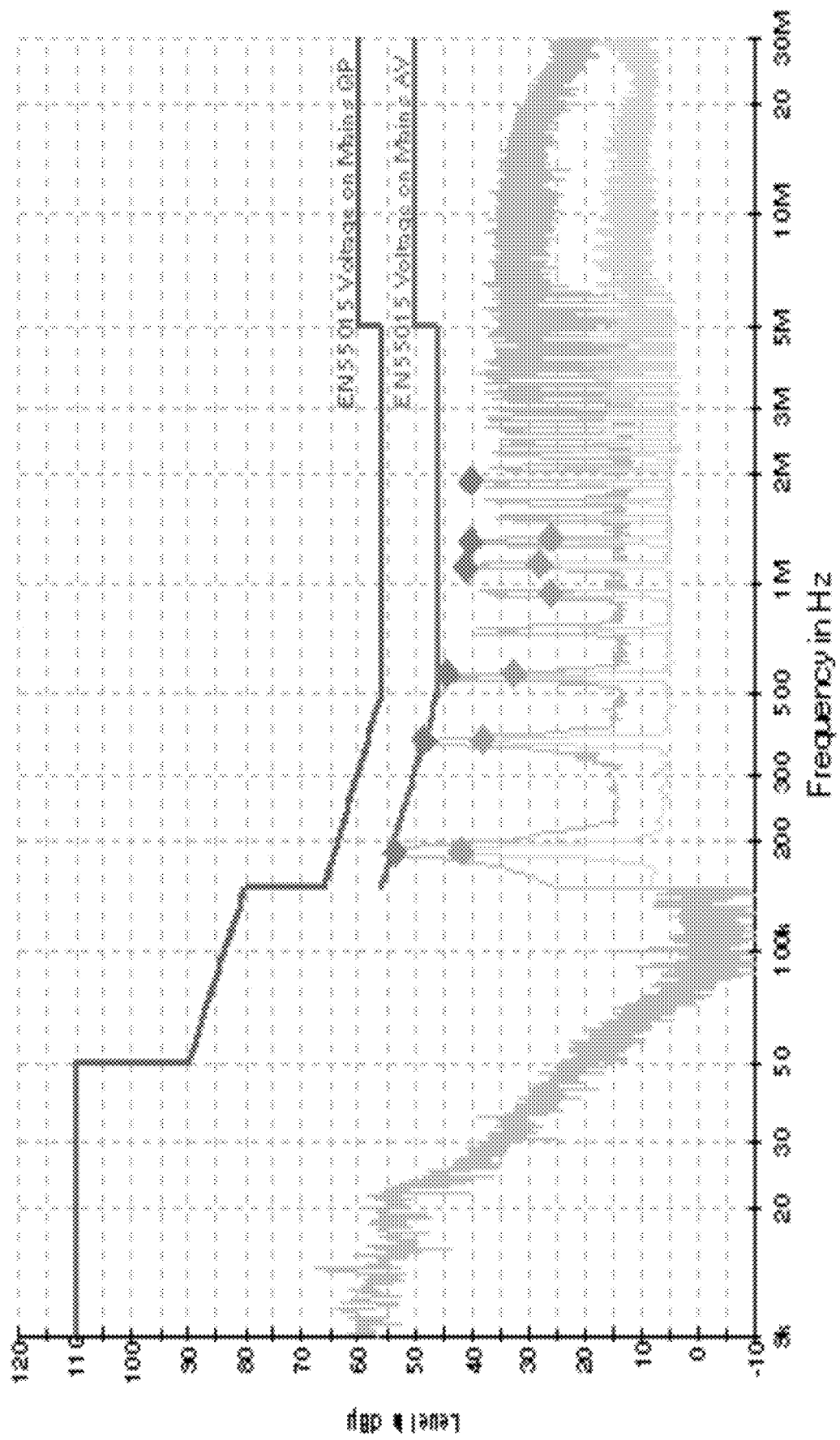
FIG. 7 is another waveform showing an embodiment of an experimental data of an apparatus two.

Referring to FIG. 7, a waveform shows an experimental data of a lighting apparatus two according to table five and table six.

According to a standard value of EN five-five-zero-one-five standard, a quasi-peak and an average of the lighting apparatus one both exceed in a band of three hundred and forty eight KHz to one thousand and fifty KHz, and the worst occurs in the band of eight hundred and seventy four point five KHz with minus eight point seven dB. The quasi-peak and the average of the lighting apparatus two both have surplus in all band, the least occurs in the band of one hundred and sixty eight KHz with thirteen point five dB, comparing with the other circuit connection in FIG. 7, and the least occurs in the band of three hundred and seventy five KHz with ten point two dB.

Result of the voltage interference of the power terminal in a naught wire according to EN five-five-zero-one-five standard.

A Naught wire corresponding to the lighting apparatus one.

TABLE SEVEN

| Frequency (MHz) | Quasi Peak (dBµV) | Meas. Time (ms) | Bandwidth (kHz) | Filter | Line | Corr. (dB) | Margin (dB) | Limit (dBµV) |
|---|---|---|---|---|---|---|---|---|
| 0.352500 | 66.7 | 1000.0 | 9.000 | Off | N | 9.8 | −7.8 | 58.9 |
| 1.050000 | 66.6 | 1000.0 | 9.000 | Off | N | 9.7 | −10.6 | 56.0 |
| 1.576500 | 64.9 | 1000.0 | 9.000 | Off | N | 9.7 | −8.9 | 56.0 |

TABLE EIGHT

| Frequency (MHz) | CAverage (dBµV) | Meas. Time (ms) | Bandwidth (kHz) | Filter | Line | Corr. (dB) | Margin (dB) | Limit (dBµV) |
|---|---|---|---|---|---|---|---|---|
| 0.348000 | 52.0 | 1000.0 | 9.000 | Off | N | 9.8 | −2.9 | 49.0 |
| 0.874500 | 47.7 | 1000.0 | 9.000 | Off | N | 9.8 | −1.7 | 46.0 |
| 1.050000 | 48.2 | 1000.0 | 9.000 | Off | N | 9.7 | −2.2 | 46.0 |

Figure 8:
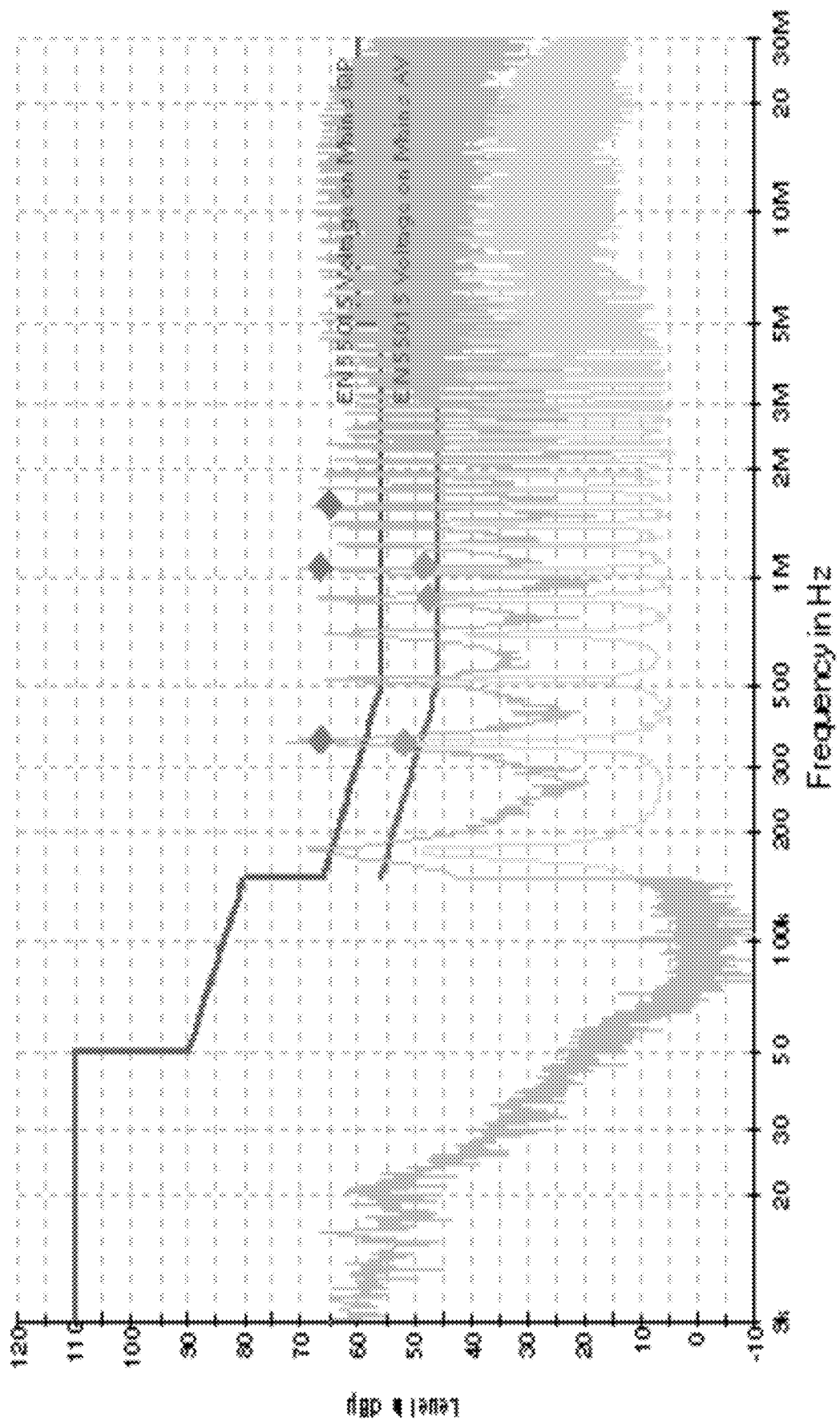
FIG. 8 is a waveform showing an embodiment of an experimental data of an apparatus one.

Referring to FIG. 8, a waveform shows an experimental data of a lighting apparatus one according to table seven and table eight.

TABLE NINE

| Frequency (MHz) | Quasi Peak (dBµV) | Meas. Time (ms) | Bandwidth (kHz) | Filter | Line | Corr. (dB) | Margin (dB) | Limit (dBµV) |
|---|---|---|---|---|---|---|---|---|
| 0.168000 | 52.4 | 1000.0 | 9.000 | Off | N | 9.7 | 12.6 | 65.1 |
| 0.334500 | 47.5 | 1000.0 | 9.000 | Off | N | 9.8 | 11.8 | 59.3 |

TABLE TEN

| Frequency (MHz) | CAverage (dBµV) | Meas. Time (ms) | Bandwidth (kHz) | Filter | Line | Corr. (dB) | Margin (dB) | Limit (dBµV) |
|---|---|---|---|---|---|---|---|---|
| 0.168000 | 41.5 | 1000.0 | 9.000 | Off | N | 9.7 | 13.5 | 55.1 |
| 0.334500 | 38.8 | 1000.0 | 9.000 | Off | N | 9.8 | 10.5 | 49.3 |

Figure 9:
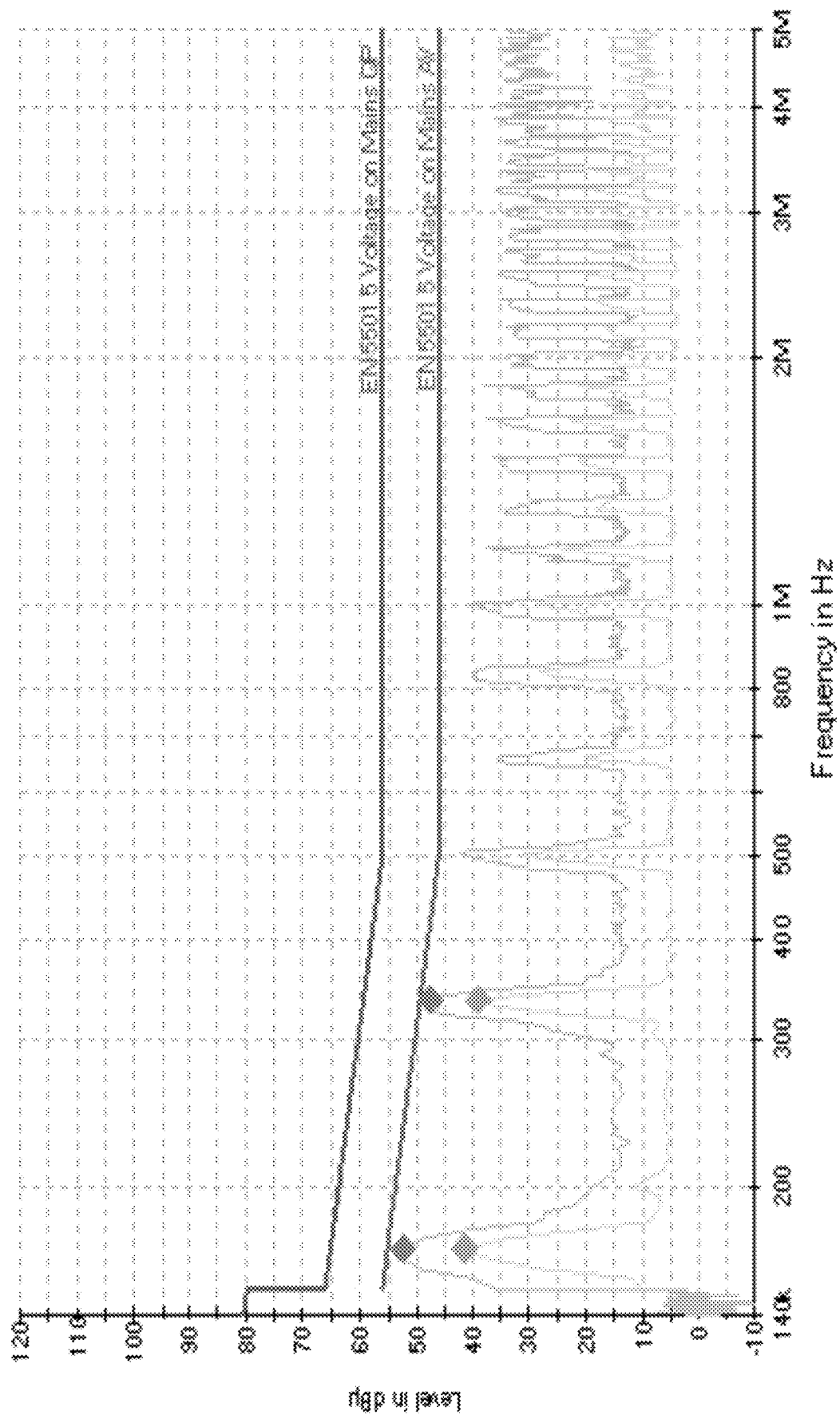
FIG. 9 is a waveform showing an embodiment of an experimental data of an apparatus two.

Referring to FIG. 9, a waveform shows an experimental data of a lighting apparatus two according to table nine and table ten.

In the circumstance that the inductor of the π-filter circuit connects with the output cathode of the full-bridge rectification. Result of the naught wire corresponding to the lighting apparatus two.

TABLE ELEVEN

| Frequency (MHz) | MaxPeak-MaxHold (dBµV) | Filter | Line | Corr. (dB) | Margin (dB) | Limit (dBµV) |
|---|---|---|---|---|---|---|
| 0.181500 | 46.1 | Off | N | 9.7 | 18.3 | 64.4 |
| 0.361500 | 42.3 | Off | N | 9.8 | 16.4 | 58.7 |
| 0.537000 | 40.2 | Off | N | 9.8 | 15.8 | 56.0 |
| 1.550500 | 40.8 | Off | N | 9.8 | 15.2 | 56.0 |
| 1.081500 | 36.5 | Off | N | 9.7 | 19.5 | 56.0 |
| 1284000 | 37.7 | Off | N | 9.7 | 18.3 | 56.0 |

TABLE TWELVE

| Frequency (MHz) | Average-MaxHold (dBµV) | Filter | Line | Corr. (dB) | Margin (dB) | Limit (dBµV) |
|---|---|---|---|---|---|---|
| 0.181500 | 34.4 | Off | N | 9.7 | 20.0 | 54.4 |
| 0.361500 | 32.8 | Off | N | 9.8 | 15.9 | 48.7 |
| 0.550500 | 28.3 | Off | N | 9.8 | 17.7 | 46.0 |
| 0.910500 | 23.0 | Off | N | 9.8 | 23.0 | 46.0 |

TABLE TWELVE-continued

| Frequency (MHz) | Average-MaxHold (dBµV) | Filter | Line | Corr. (dB) | Margin (dB) | Limit (dBµV) |
|---|---|---|---|---|---|---|
| 1.095000 | 26.0 | Off | N | 9.7 | 20.0 | 46.0 |
| 1.279500 | 23.9 | Off | N | 9.7 | 22.1 | 46.0 |

Figure 10:
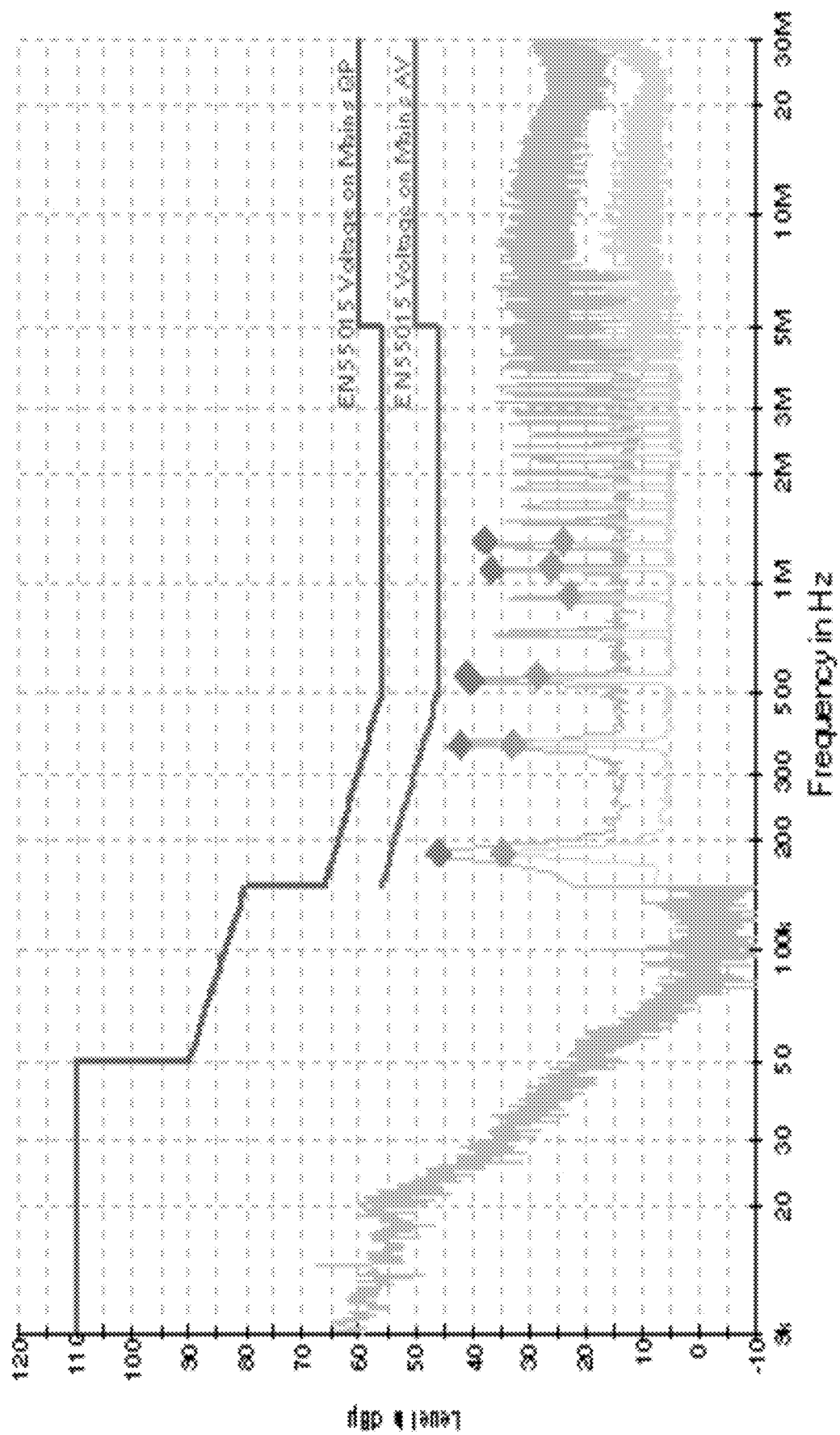
FIG. 10 is another waveform showing an embodiment of an experimental data of an apparatus two.

Referring to FIG. 10, a waveform shows an experimental data of a lighting apparatus two according to table eleven and table twelve.

Referring to FIG. 10, the quasi-peak and the average of the lighting apparatus one both exceed in the band of three hundred and fifty-two point five KHz to a one thousand and fifty KHz, the worst occurs in the band of one thousand and fifty KHz with minus ten point six dB. The quasi-peak and the average of the lighting apparatus two both have surplus in all band, the least occurs in the band of three hundred and thirty-four point five KHz with ten point five dB. In the other circuit connection in FIG. 10, in the test of the naught wire corresponding to the lighting apparatus two, the least occurs in the band of three hundred and sixty-one point five KHz with fifteen point five dB.

According to the result of testing the live wire and the naught wire, the lighting apparatus one is incapable of meeting EN five-five-zero-one-five standard. The lighting apparatus two provided is capable of meeting EN five-five-zero-one-five standard and has at least ten dB surplus.

Result of electromagnetic radiation interference to the two lights (3M anechoic chamber) according to EN five-five-zero-one-five standard.

TABLE THIRTEEN

| Frequency (MHz) | MaxPeak (dB:i V/m) | Limit (dB:i V/m) | Margin (dB) | Bandwidth (kHz) | Height (cm) | Pol | Azimuth (deg) | Corr. (dB) |
|---|---|---|---|---|---|---|---|---|
| 212.057143 | 36.76 | 40.00 | 3.24 | . . . | 100.0 | H | 323.0 | 11.9 |
| 213.773571 | 36.50 | 40.00 | 3.50 | . . . | 100.0 | H | 323.0 | 12.2 |
| 210.360000 | 36.24 | 40.00 | 3.76 | . . . | 100.0 | H | 323.0 | 11.6 |
| 212.500714 | 36.22 | 40.00 | 3.78 | . . . | 100.0 | H | 105.0 | 12.0 |
| 212.905714 | 36.11 | 40.00 | 3.89 | . . . | 100.0 | H | 323.0 | 12.0 |
| 214.178571 | 35.93 | 40.00 | 4.07 | . . . | 100.0 | H | 290.0 | 12.2 |

Figure 11:
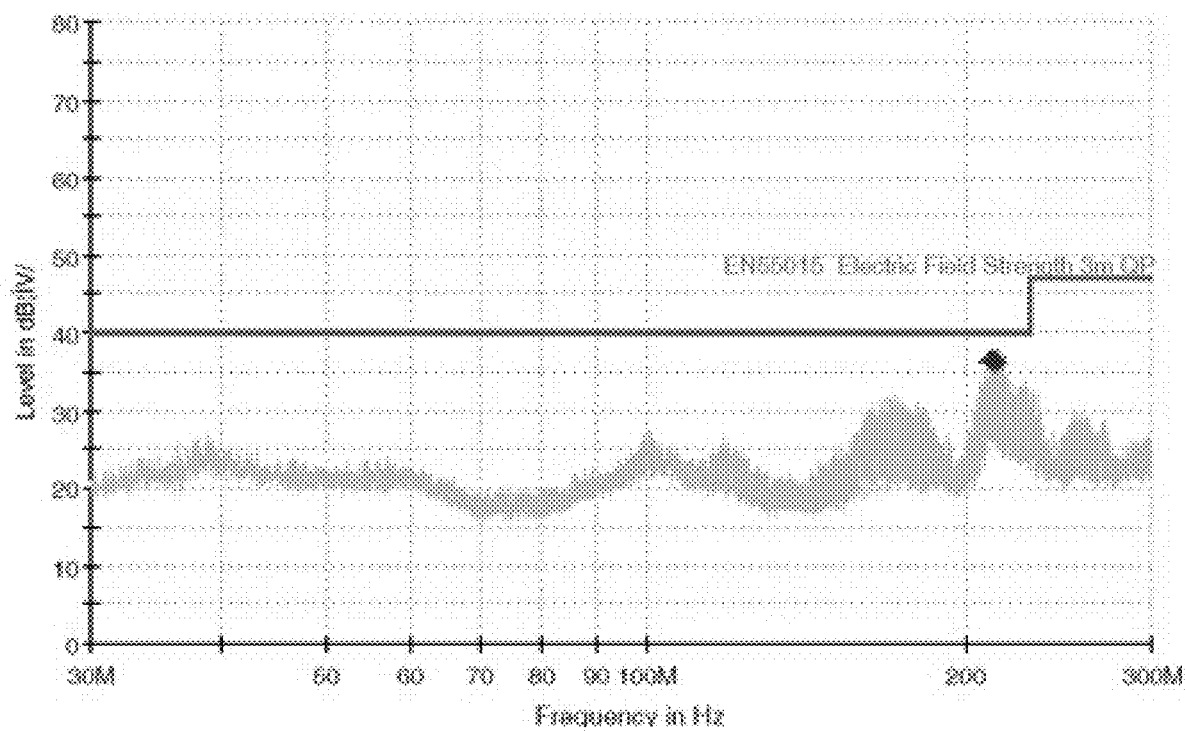
FIG. 11 is a waveform showing an embodiment of an experimental data of an apparatus one.

Referring to FIG. 11, a waveform shows an experimental data of a lighting apparatus one according to table thirteen.

TABLE FOURTEEN

| Frequency (MHz) | MaxPeak (dB:i V/m) | Limit (dB:i V/m) | Margin (dB) | Bandwidth (kHz) | Height (cm) | Pol | Azimuth (deg) | Corr. (dB) |
|---|---|---|---|---|---|---|---|---|
| 217.958571 | 29.07 | 40.00 | 10.93 | . . . | 100.0 | H | 283.0 | 12.3 |
| 212.057143 | 27.82 | 40.00 | 12.18 | . . . | 100.0 | H | 283.0 | 11.9 |
| 216.203571 | 27.43 | 40.00 | 12.57 | . . . | 100.0 | H | 283.0 | 12.4 |
| 212.790000 | 27.20 | 40.00 | 12.80 | . . . | 100.0 | H | 283.0 | 12.0 |
| 214.641429 | 27.20 | 40.00 | 12.80 | . . . | 100.0 | H | 283.0 | 12.3 |
| 217.148571 | 27.13 | 40.00 | 12.87 | . . . | 100.0 | H | 283.0 | 12.3 |

Figure 12:
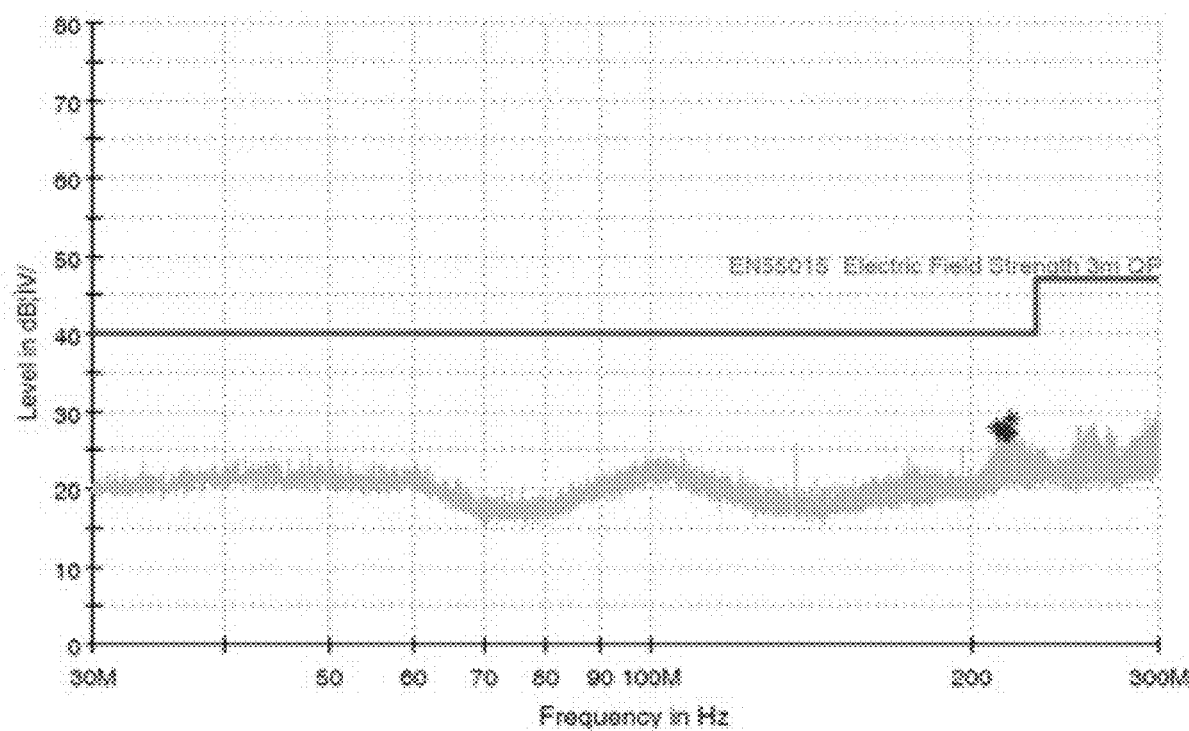
FIG. 12 is a waveform showing an embodiment of an experimental data of an apparatus two.

Referring to FIG. 12, a waveform shows an experimental data of a lighting apparatus two according to table fourteen.

TABLE FIFTEEN

| Frequency (MHz) | MaxPeak (dB:i V/m) | Limit (dB:i V/m) | Margin (dB) | Meas. Time (ms) | Bandwidth (kHz) | Height (cm) | Pol | Azimuth (deg) | Corr. (dB) |
|---|---|---|---|---|---|---|---|---|---|
| 38.678571 | 36.50 | 40.00 | 3.50 | 10.0 | 120.000 | 100.0 | V | 270.0 | 13.6 |

Figure 13:
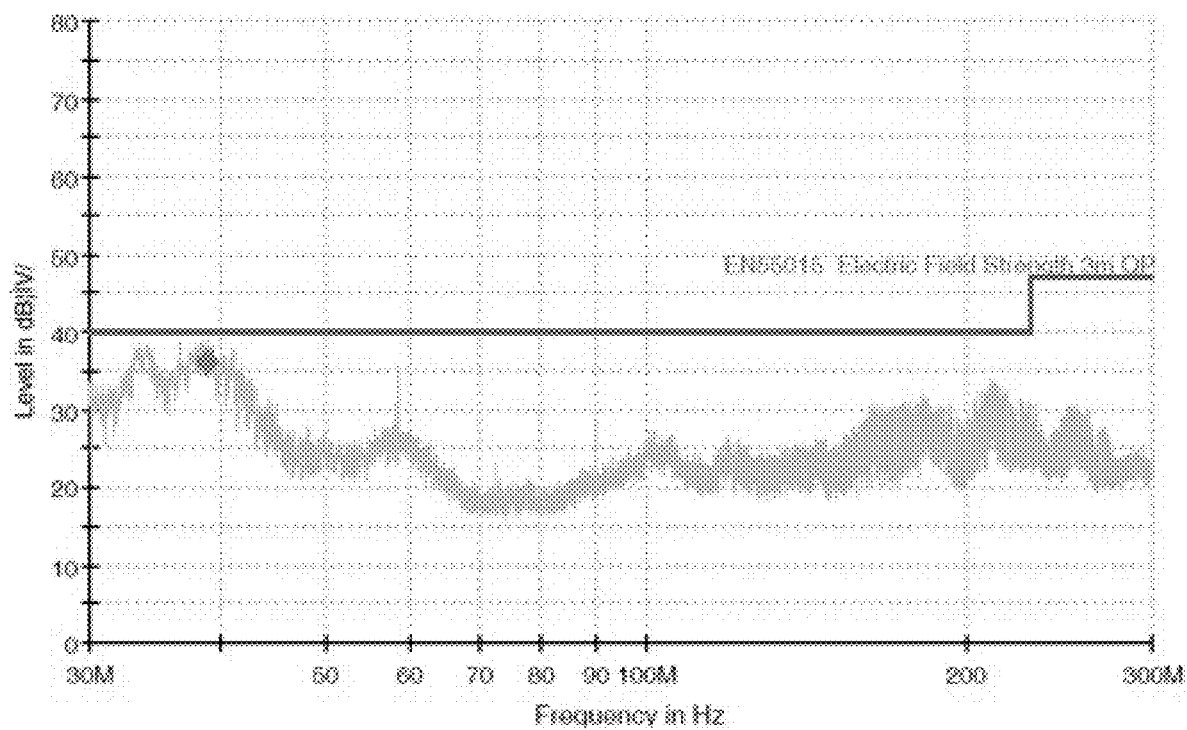
FIG. 13 is a waveform showing an embodiment of an experimental data of an apparatus one.

Referring to FIG. 13, a waveform shows an experimental data of a lighting apparatus one according to table fifteen.

TABLE SIXTEEN

| Frequency (MHz) | MaxPeak (dB:i V/m) | Limit (dB:i V/m) | Margin (dB) | Bandwidth (kHz) | Height (cm) | Pol | Azimuth (deg) | Corr. (dB) |
|---|---|---|---|---|---|---|---|---|
| 211.497857 | 26.97 | 40.00 | 13.03 | . . . | 100.0 | V | 326.0 | 11.8 |
| 40.375714 | 25.27 | 40.00 | 14.73 | . . . | 100.0 | V | 326.0 | 14.0 |
| 102.070714 | 24.91 | 40.00 | 15.09 | . . . | 100.0 | V | 135..0 | 13.6 |
| 44.888571 | 24.51 | 40.00 | 15.49 | . . . | 100.0 | V | 43.0 | 13.9 |
| 177.285000 | 24.24 | 40.00 | 15.76 | . . . | 100.0 | V | 166.0 | 10.3 |
| 94.144286 | 22.73 | 40.00 | 17.27 | . . . | 100.0 | V | 166.0 | 12.3 |

Figure 14:
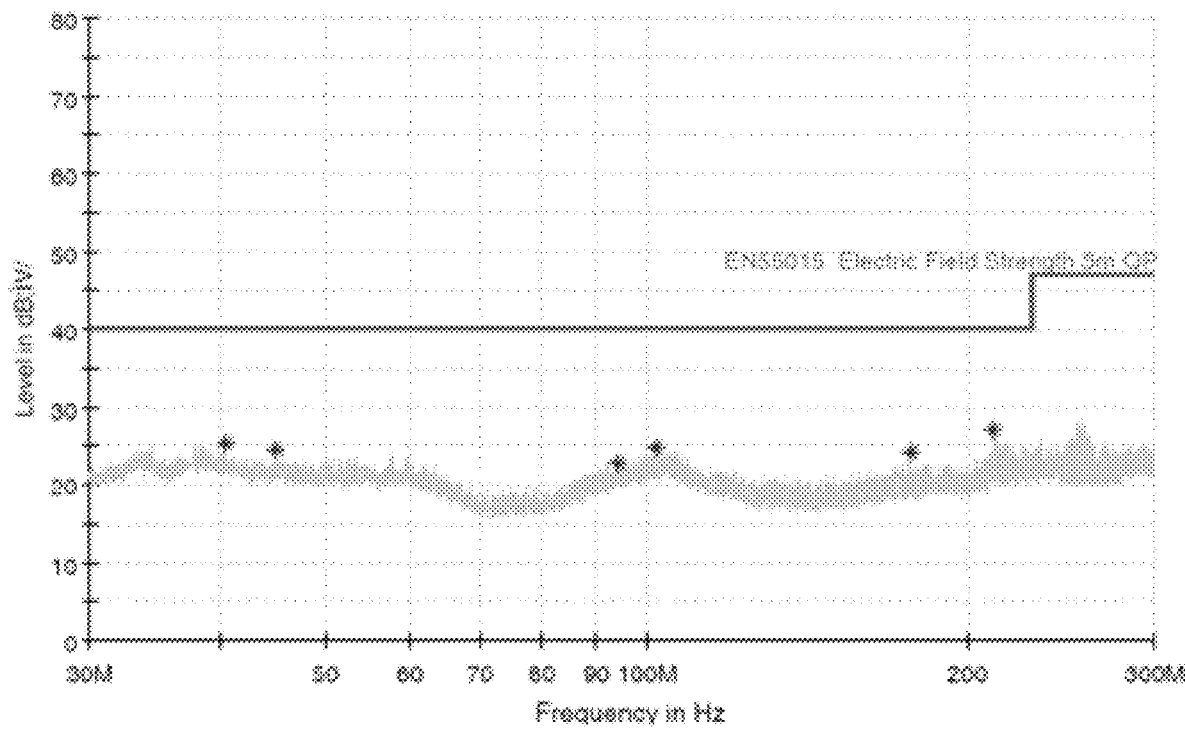
FIG. 14 is a waveform showing an embodiment of an experimental data of an apparatus two.

Referring to FIG. 14, a waveform shows an experimental data of a lighting apparatus two according to table sixteen.

According to the result of testing a H and a V radiation pattern, the lighting apparatus one has only critically three point five to three point five dB. The lighting apparatus two provided is capable of meeting EN five-five-zero-one-five standard and has at least ten dB surplus, reducing the interference of the electromagnetic energy generated by the high-frequency switch signal to other appliances and shielding the electromagnetic interference. Furthermore, meeting the standard of the voltage interference of the power terminal and the electromagnetic radiation interference and fulfilling the requirement of electromagnetic compatibility in countries and areas.

The LED lighting apparatus provided has the LED power driving circuit having the full-bridge rectification, the π-filter circuit and the non-isolated switch driving circuit common connected to form the power ground, the power ground connects with the conducting element of the base of the LED lighting apparatus, conducting the high-frequency switch signal of the power driving circuit to the conducting elements of the base of the lighting apparatus, reducing the interference of the electromagnetic energy generated by the high-frequency switch signal to other appliances and shielding the electromagnetic interference. The LED lighting apparatus meeting the certificated standard is capable of applying switch driving technique to carry out the design of placing a driver on board, and further, regulating a broad input voltage while maintaining high-efficient production.

Figure 15:
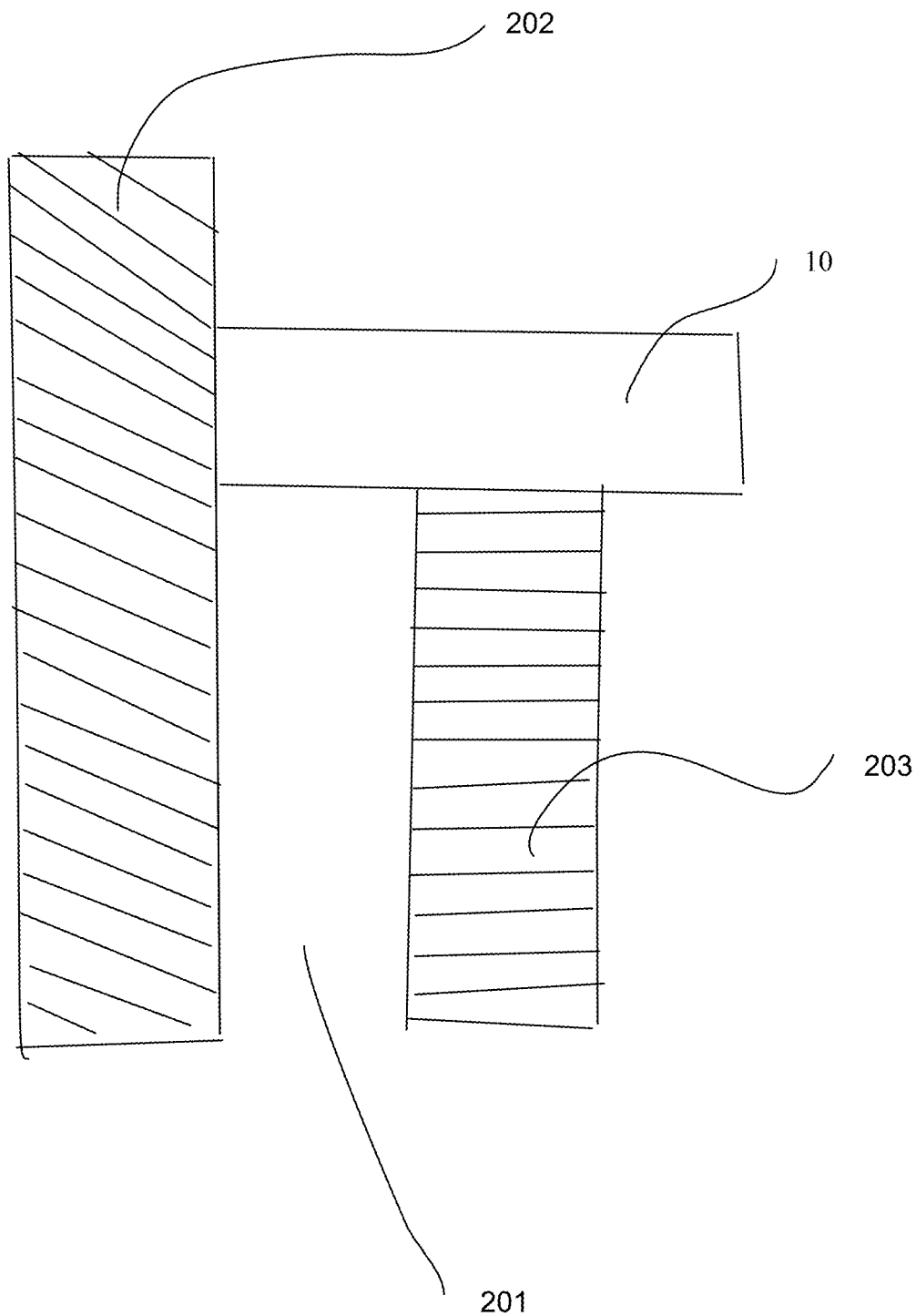
FIG. 15 is a partial figure of an embodiment of a lighting apparatus.
Figure 16:
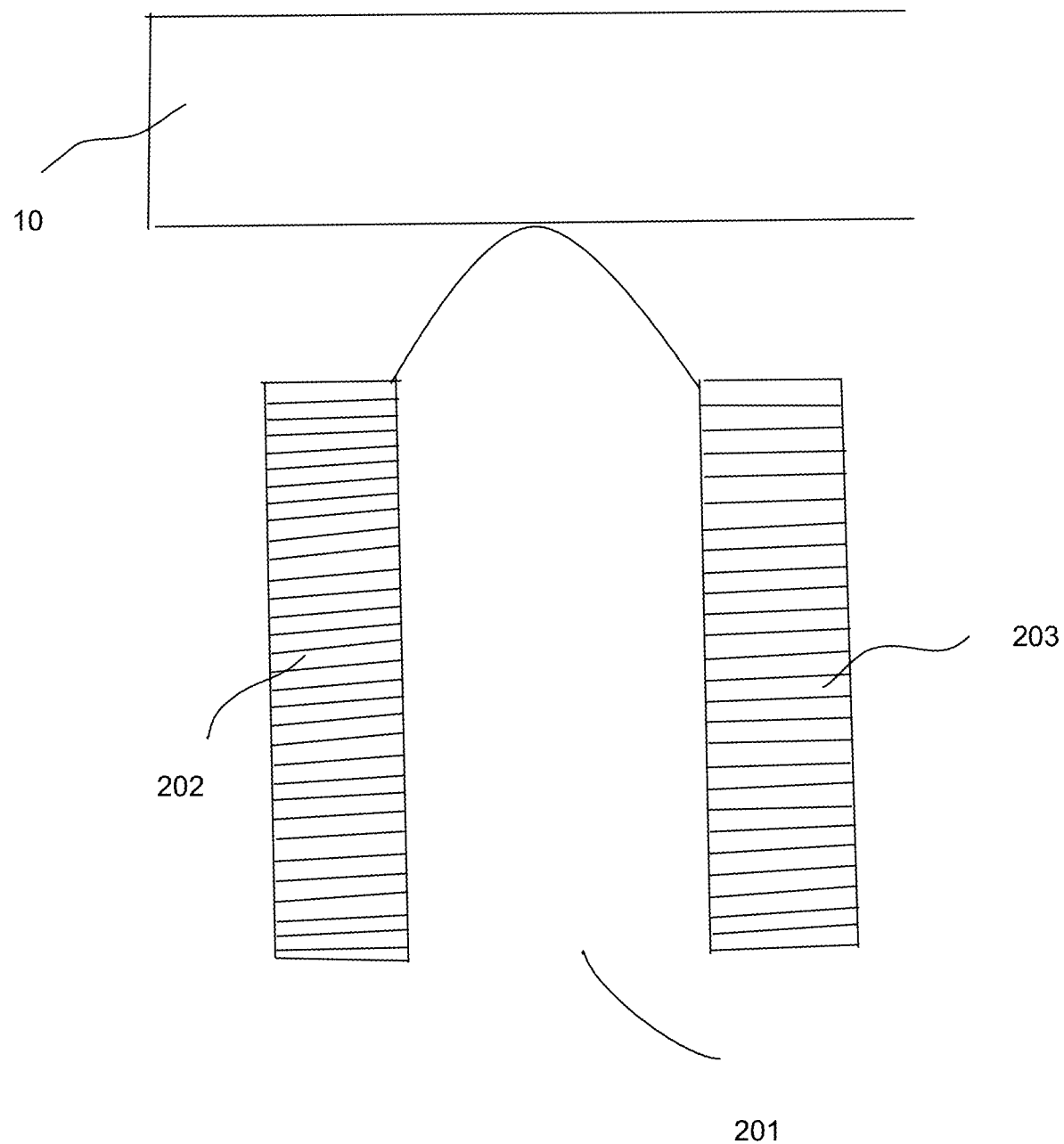
FIG. 16 is a partial figure of an embodiment of a lighting apparatus with layer.

Referring to FIG. 15, an embodiment of a lighting apparatus has a circuit board 10 including an inner insulation layer 203. The conducting element 201 is inserted between the outer insulation layer 202 and the inner insulation layer 203. Referring to FIG. 16, in another embodiment of the lighting apparatus has the outer insulation layer 202 and the inner insulation layer 203. A top surface of the conducting element 201 has a wave structure configured to contact the circuit board 10.

Figure 17:
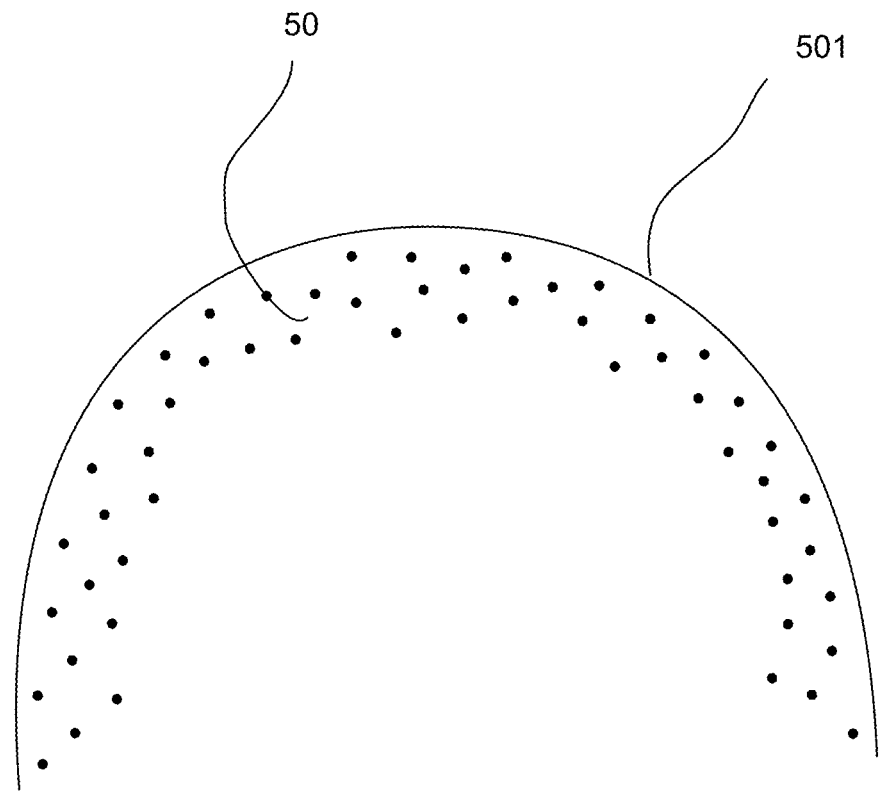
FIG. 17 is a partial figure of an embodiment of a lighting apparatus with layer.
Figure 18:
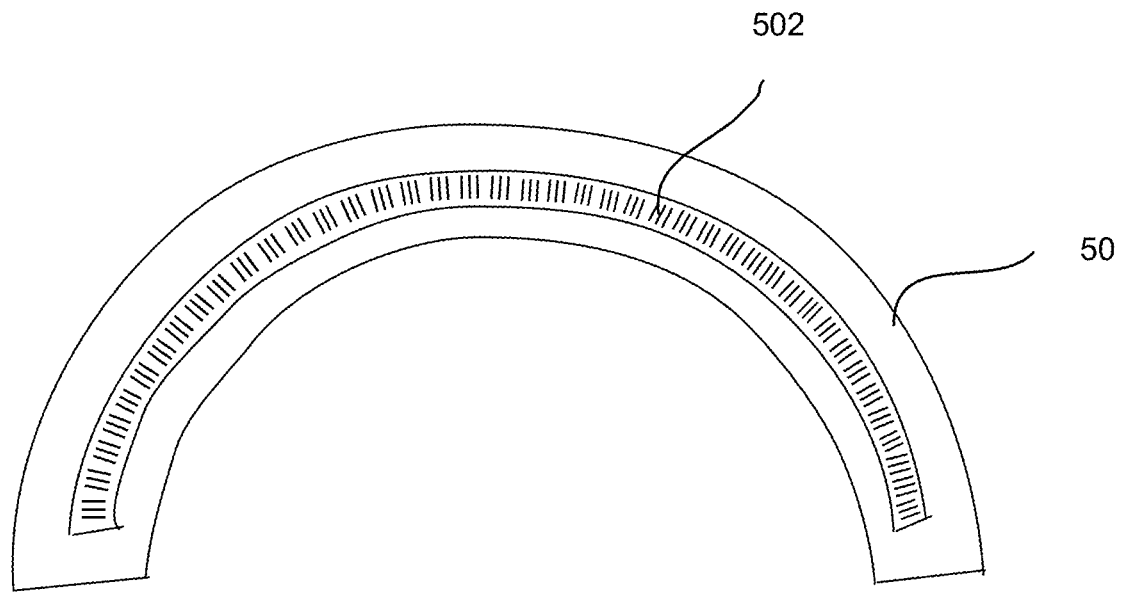
FIG. 18 is a partial figure of an embodiment of a lighting apparatus with layer.
Figure 19:
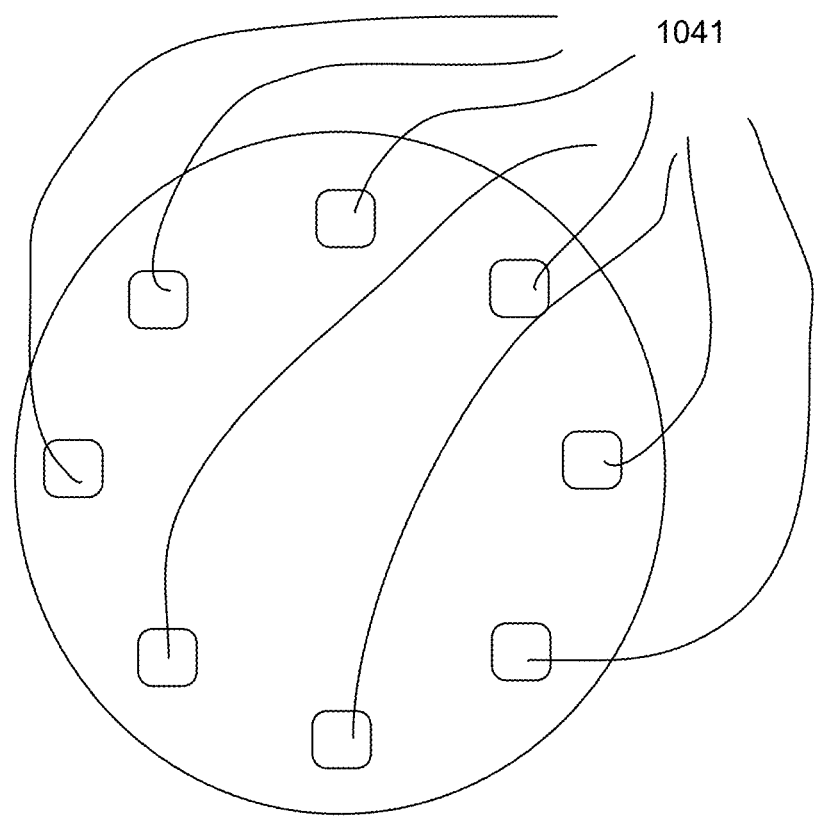
FIG. 19 is a partial figure of an embodiment of a LED lighting apparatus.
Figure 20:
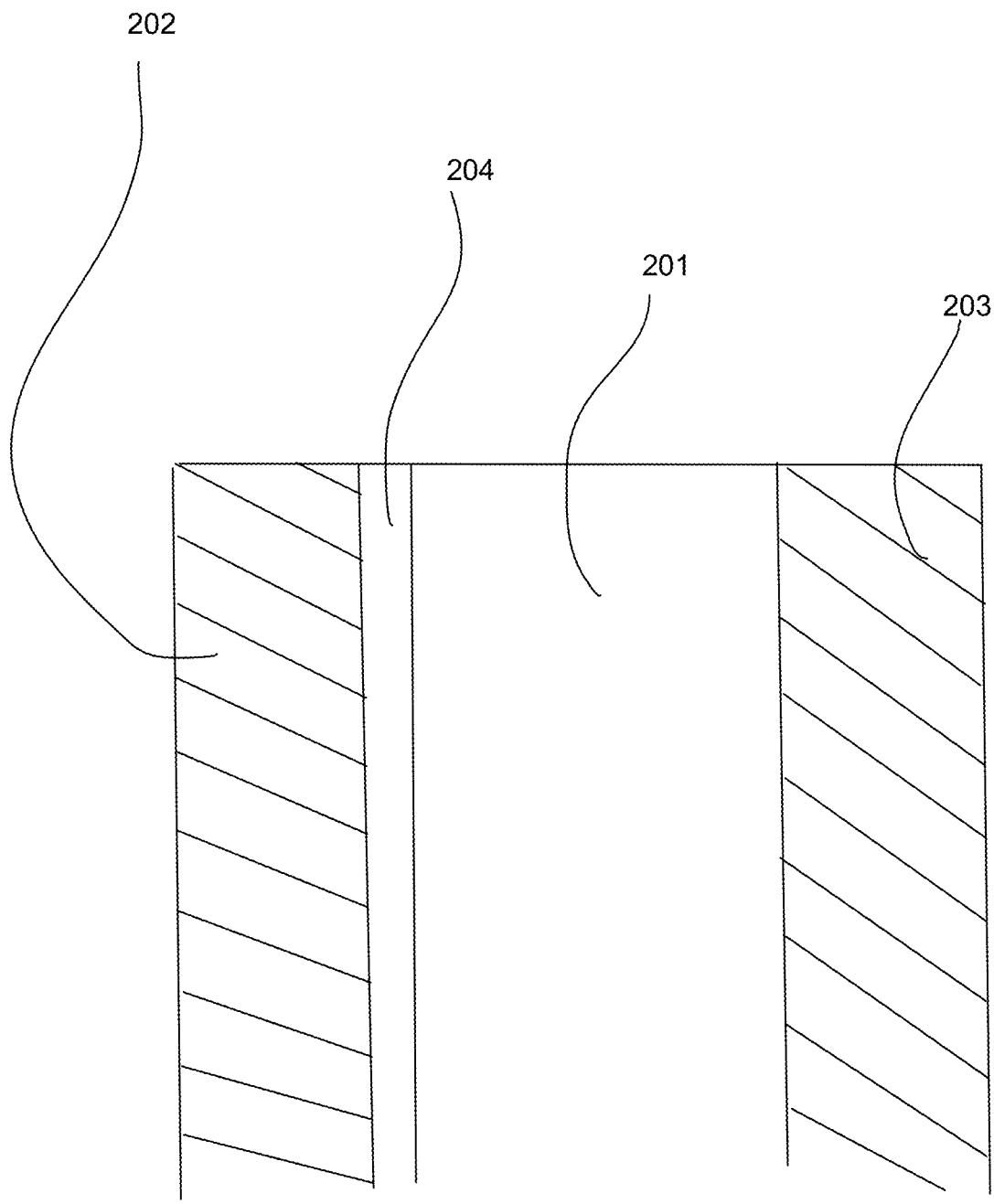
FIG. 20 is a partial figure of an embodiment of a lighting apparatus with layer.

Referring to FIG. 17, an embodiment of a conversion structure includes a phosphor layer 501 configure on an inner surface of a light cover 50. Referring to FIG. 18, another embodiment of a conversion layer 502 configure within a surface of the light cover 50, and the conversion layer 502 may be a hollow structure filled with quantum dots. Referring to FIG. 19, in an embodiment of a lighting apparatus, the LEDs 1041 are installed on a periphery of the circuit board, and the heat dissipation may efficiency increase. Referring to FIG. 20, a metal shielding layer 204 may be configured between the outer insulation layer 202, the inner insulation layer 203 and the conducting element 201.

In addition to the above-described embodiments, various modifications may be made, and as long as it is within the spirit of the same invention, the various designs that can be made by those skilled in the art are belong to the scope of the present invention.

The invention claimed is:

1. A lighting apparatus, comprising:
   a circuit board comprising a light source emitting light and a power driving circuit electrically connecting to the light source; and
   a base supporting the circuit board, wherein the base comprises a conducting element;
   wherein the power driving circuit is electrically connected to the conducting element;
   wherein the power driving circuit comprises a full-bridge rectification circuit, a pi-filter circuit and a non-isolated switch driving circuit electrically are connected in sequence, an output end of the non-isolated switch driving circuit connects to the light source and the full-bridge rectification circuit, the pi-filter circuit and the non-isolated switch driving circuit cooperatively form a power ground, and the power ground is connected to the conducting element via a metal contact pad;
   wherein the metal contact pad has a first segment and a second segment, the first segment from the power ground extends to an edge of the circuit board, and the second segment extends along a side of the circuit board and connects to the conducting element;
   wherein a full-bridge rectification input terminal is a positive electrode input of a LED power driving circuit, the full-bridge rectification circuit is connected to a power signal to output a voltage signal from a positive output terminal, and a negative output terminal is connected to a ground, a first input terminal is connected to a positive output terminal of the full-bridge rectification circuit, a first output terminal of the pi-filter circuit is connected to a positive electrode output of the LED power driving circuit, a second input terminal of the pi-filter circuit is connected to the ground, a second output terminal of the pi-filter circuit is connected to a second input terminal of the non-isolated switch driving circuit, a first input terminal of the non-isolated switch driving circuit is connected to the first output terminal of the pi-filter circuit, the first output terminal of the non-isolated switch driving circuit is connected to the positive electrode output of the LED power driving circuit, the second output terminal of the non-isolated switch driving circuit is connected to a negative electrode output of the LED power driving circuit, a ground terminal of the non-isolated switch driving circuit is connected to the ground;
   wherein the non-isolated switch driving circuit comprises a diode, a first resistor, a second resistor, a third resistor, a second inductor, a third capacitor, and a driving chip, a first pin of the driving chip is used as the first input terminal of the non-isolated switch driving circuit, the first terminal of the second inductor is used as the second output terminal of the non-isolated switch driving circuit, a second terminal of the first resistor and a second terminal of the second resistor is used as the second input terminal of the non-isolated switch driving circuit, a positive electrode of the diode is connected to a second pin of the driving chip and the second terminal of the second inductor, the positive electrode of the diode is connected to the positive electrode output of the LED power driving circuit, a first terminal of the third capacitor is connected to the negative electrode output of the LED power driving circuit, a second terminal of the third capacitor is connected to the positive electrode output of the LED power driving circuit, a first terminal of the third resistor is connected to the positive electrode output of the LED power driving circuit, a second terminal of the third resistor is connected to the negative electrode output of the LED power driving circuit, a third pin of the driving chip is connected to the first terminal of the first resistor and the first terminal of the second resistor, the second terminal of the first resistor, the second terminal of the second resistor, and a fourth pin of the driving circuit are common grounded.

2. The lighting apparatus of claim 1, wherein the pi-filter circuit comprises a first inductor, a first capacitor, and a second capacitor, a first terminal of the first inductor is connected to the first input terminal of the pi-filter circuit, a second terminal of the first inductor is connected to the first output terminal of the pi-filter circuit, the first terminal of the first inductor is connected to a first terminal of the first capacitor, a second terminal of the first capacitor is common grounded with a second terminal of the second capacitor, the second terminal of the first capacitor is connected to the second terminal of the second capacitor, the second terminal of the second capacitor is connected to the power ground;

wherein the first terminal of the first capacitor and a first terminal of the second capacitor is connected to the first input terminal of the pi-filter circuit, the second terminal of the second capacitor and the second terminal of the first inductor is connected to the second output terminal of the pi-filter circuit, the second terminal of the second capacitor and the second terminal of the first inductor is connected to the second output terminal of the pi-filter circuit, the second terminal of the first capacitor is common grounded with the first terminal of the first inductor, the second terminal of the second capacitor is connected to the second terminal of the first inductor and the power ground.

* * * * *